(12) United States Patent
Takeyama

(10) Patent No.: US 8,072,798 B2
(45) Date of Patent: Dec. 6, 2011

(54) SEMICONDUCTOR MEMORY DEVICE

(75) Inventor: Yasuhisa Takeyama, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 54 days.

(21) Appl. No.: 12/496,844

(22) Filed: Jul. 2, 2009

(65) Prior Publication Data

US 2010/0002496 A1    Jan. 7, 2010

(30) Foreign Application Priority Data

Jul. 2, 2008 (JP) .................. 2008-173419

(51) Int. Cl.
*G11C 11/00* (2006.01)
*G11C 11/412* (2006.01)
(52) U.S. Cl. ....................................... 365/154
(58) Field of Classification Search ............ 365/154
See application file for complete search history.

(56) References Cited

U.S. PATENT DOCUMENTS 7,123,504 B2    10/2006  Yabe
2005/0232058 A1*  10/2005  Yabe ................ 365/230.03
2006/0227595 A1*  10/2006  Chuang et al. .......... 365/154
2007/0183185 A1    8/2007  Guo et al.
2007/0279966 A1*  12/2007  Houston ................... 365/154

OTHER PUBLICATIONS

"FinFET SRAM with Enhanced Read/Write Margins", A. Carlson et al., 2006 IEEE International SOI Conference Proceedings pp. 105-106.

* cited by examiner

*Primary Examiner* — Hoai V Ho
*Assistant Examiner* — Jay Radke
(74) *Attorney, Agent, or Firm* — Oblon, Spivak, McClelland, Maier & Neustadt, L.L.P.

(57) ABSTRACT

The semiconductor memory device includes: an inverter pair of a cross-coupled first and second inverters; a first transfer transistor including a front gate and a back gate connected to a first node to which an output terminal of the first inverter and an input terminal of the second inverter are connected; a second transfer transistor including a front gate and a back gate connected to a second node to which an output terminal of the second inverter and an input terminal of the first inverter are connected; a driver transistor whose gate is connected to the second node; and a read transistor including a front gate, a back gate connected to the second node, and a current path whose one end is connected to one end of a current path of the driver transistor.

18 Claims, 18 Drawing Sheets

US 8,072,798 B2

SEMICONDUCTOR MEMORY DEVICE

CROSS-REFERENCE TO RELATED APPLICATIONS

This application is based upon and claims the benefit of priority from the prior Japanese Patent Application No. 2008-173419, filed Jul. 2, 2009, the entire contents of which are incorporated herein by reference.

BACKGROUND OF THE INVENTION

1. Field of the Invention

The present invention relates to a semiconductor memory device, and particularly, relates to a static RAM (SRAM).

2. Description of the Related Art

In recent years, the size of transistors constituting a memory cell and the like has been reduced for improvement in integration density of semiconductor memory devices. In addition, along with lowering of supply voltage, the threshold voltage of such transistors has also been lowered. For these reasons, fluctuation in the threshold voltage of the transistors constituting the memory cell has increasingly given a large influence on operation of the memory cell.

Particularly in the SRAMs, fluctuation in the threshold voltage of the transistors constituting the memory cell reduces a static noise margin (hereinafter, SNM) of the memory cell. A memory cell having a low SNM does not have stable operation. Therefore, when a weak voltage is applied from a bit line due to noise and the like, erroneous write to the memory cell occurs due to the weak voltage. For that reason, a transistor for data transfer (hereinafter, transfer transistor) is conducted to a memory cell connected to a word line to which a selected memory cell is connected (hereinafter, a non-selected memory cell). Accordingly, when the SNM is low, unnecessary writing occurs due to noise and the like transferred from the bit line.

In consequence, the SRAMs formed with a configuration known in the prior art have problems associated with lowering of the supply voltage and reduction of the transistor size.

As countermeasures against that, a method has been disclosed in which: the transfer transistor is formed of a FinFET; a gate of the transfer transistor is divided into a front gate and a back gate; and the back gate is connected to a storage node of a memory cell. Here, the FinFET has a structure in which: a channel part is formed on an insulating layer of a semiconductor substrate; and an upper surface and right and left side surfaces of the channel part are surrounded by a gate electrode with an insulating film therebetween. Since the channel part is covered with the insulating film and these surfaces of the channel part are controlled by the gates, leakage current when the device is OFF can be reduced.

With this method, since the back gate of one of the transfer gates is connected to a node that stores data of "L", the back gate is at an "L" level. When the back gate is at the "L" level, the threshold voltage of the transistor is high. Thereby, the threshold voltage of the transfer transistor of a non-selected memory cell in which the back gate of the transfer transistor is at an "L" level is high enough to make it difficult to bring the transfer transistor of the non-selected memory cell into conduction. Therefore, erroneous write can be reduced.

On the other hand, this method has a problem that a reading speed and a writing speed are slow since a threshold voltage in the transfer gate of a selected memory cell is also high.

Consequently, in the prior art, it is difficult to provide a small-sized semiconductor memory device having high operational reliability.

SUMMARY OF THE INVENTION

An object of the present invention is to provide a small-sized semiconductor memory device having high operational reliability.

A semiconductor memory device according to one aspect of the present invention includes: a bit line pair having a first bit line and a second bit line, a word line, and a memory cell formed between the bit line pair, wherein the memory cell includes: an inverter pair including a first inverter and a second inverter that are cross-coupled to each other, a first transfer transistor provided between the first bit line and an output terminal of the first inverter and including a first front gate and a first back gate, the first front gate connected to the word line, the first back gate connected to a first node to which an output terminal of the first inverter and an input terminal of the second inverter are connected, a second transfer transistor provided between the second bit line and an output terminal of the second inverter and having a second front gate and a second back gate, the second front gate connected to the word line, the second back gate connected to a second node to which an output terminal of the second inverter and an input terminal of the first inverter are connected, a first driver transistor including a first gate connected to the second node, and one end of a first current path connected to a ground voltage, and a read transistor including a third front gate and a third back gate, the third front gate connected to the word line, the read transistor including one end of a second current path connected to the other end of the first current path, and other end of the second current path connected to the first bit line.

According to the present invention, a small-sized semiconductor memory device having high operational reliability can be provided.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1A:
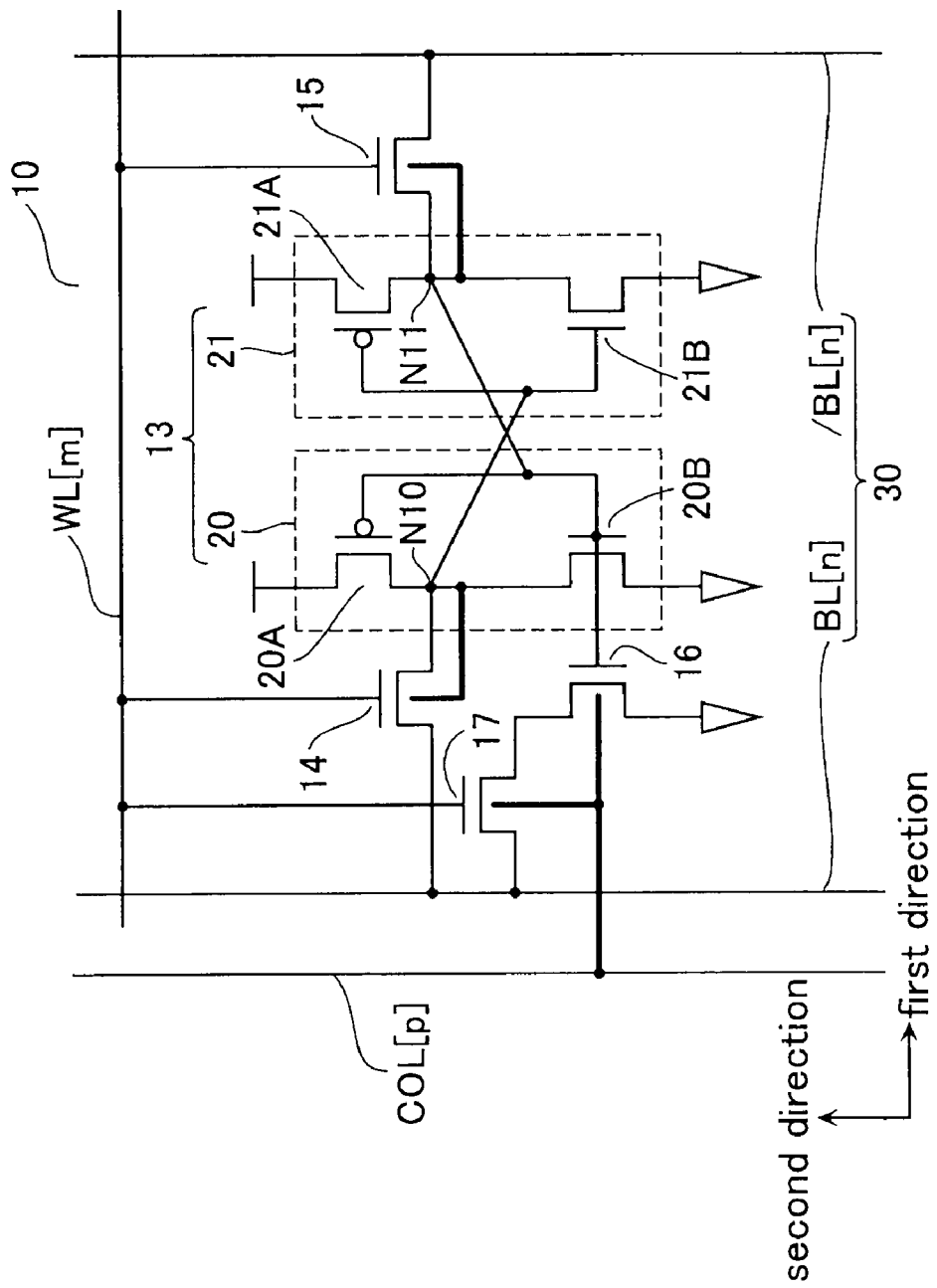
FIG. 1A is a circuit diagram showing a part of an SRAM according to a first embodiment of the present invention.

Various other objects, features and attendant advantages of the present invention will be more fully appreciated from the following detailed description when considered in connection with the accompanying drawings in which like reference characters designate like or corresponding parts throughout the several views.

First Embodiment

FIG. 1A is an equivalent circuit diagram showing a part of a semiconductor memory device (hereinafter, SRAM) 10 according to a first embodiment of the present invention. Memory cells MC constituting the SRAM 10 according to the first embodiment are formed at intersections of a plurality of word lines WL arranged in a first direction and a plurality of bit lines BL arranged in a second direction. For convenience in description, FIG. 1A shows a memory cell MC formed at an intersection of a word line WL[m] and a pair of bit lines BL[n] and /BL[n] (where m and n are natural numbers).

The memory cell MC is formed between a bit line pair 30 consisting of the bit line BL[n] and the bit line /BL[n], and includes a data storage unit 13 formed by cross-coupling an inverter 20 to an inverter 21. The inverter 20 is formed by connecting a pMOS transistor 20A and an nMOS transistor 20B in series. The inverter 21 is formed by connecting a pMOS transistor 21A and an nMOS transistor 21B in series.

Between the bit line BL[n] and the inverter 20, a transfer transistor 14 is formed for data transfer. Similarly, a transfer transistor 15 is formed for data transfer between the bit line /BL[n] and the inverter 21. The word line WL[m] is connected to a gate of the transfer transistor 14 and the bit line BL[n] is connected to a drain of the transfer transistor 14. A node N10 is connected to a source of the transfer transistor 14, an output terminal of the inverter 20 and an input terminal of the inverter 21 being connected to the node N10. The word line WL[m] is connected to a gate of the transfer transistor 15 and the bit line /BL[n] is connected to a drain of the transfer transistor 15. A node N11 is connected to a source of the transfer transistor 15, an output terminal of the inverter 21 and an input terminal of the inverter 20 being connected to the node N11.

Moreover, a gate of a driver transistor 16 is connected to the node N11, and a gate of a read transistor 17 is connected to the word line WL[m]. The driver transistor 16 and the read transistor 17 each have a current path between a source and a drain thereof. The bit line BL[n] is connected to the drain of the read transistor 17, and the source of the read transistor 17 is connected to the drain of the driver transistor 16. A ground voltage VSS is supplied to the source of the driver transistor 16. One memory cell MC is constituted of the data storage unit 13 and the transistors 14 to 17.

The transistors that constitute the memory cell MC within the SRAM according to the first embodiment are each formed of a single gate FinFET, while only the transfer transistors 14 and 15, the driver transistor 16, and the read transistor 17 are formed of a double gate FinFET. However, the driver transistor 16 may be a single gate FinFET, instead of the double gate FinFET.

Here, a configuration and operation of a FinFET will be described using FIG. 2. An n channel FinFET of the double gate used for the driver transistor 16 and the read transistor 17 in the first embodiment will be described as an example.

A semiconductor fin 50 is formed in a first direction so that a p type diffusion layer 51 may be sandwiched by two n type diffusion layers 52. The p type diffusion layer 51 is sandwiched by two gates 53 formed in a second direction. For convenience in description, for the two n type diffusion layers 52, a reference numeral 52A denotes a drain and a reference numeral 52B denotes a source. In addition, a reference numeral 52 collectively denotes the two n type diffusion layers.

When a positive voltage is applied to the gate 53, an inversion layer is formed on a surface of the p type diffusion layer 51 contacting the gate 53, and then, a current flows into the source from the drain.

The single gate FinFET has a structure in which a continuous gate is formed to contact a channel so that the current that flows within the channel is controlled.

Figure 2:
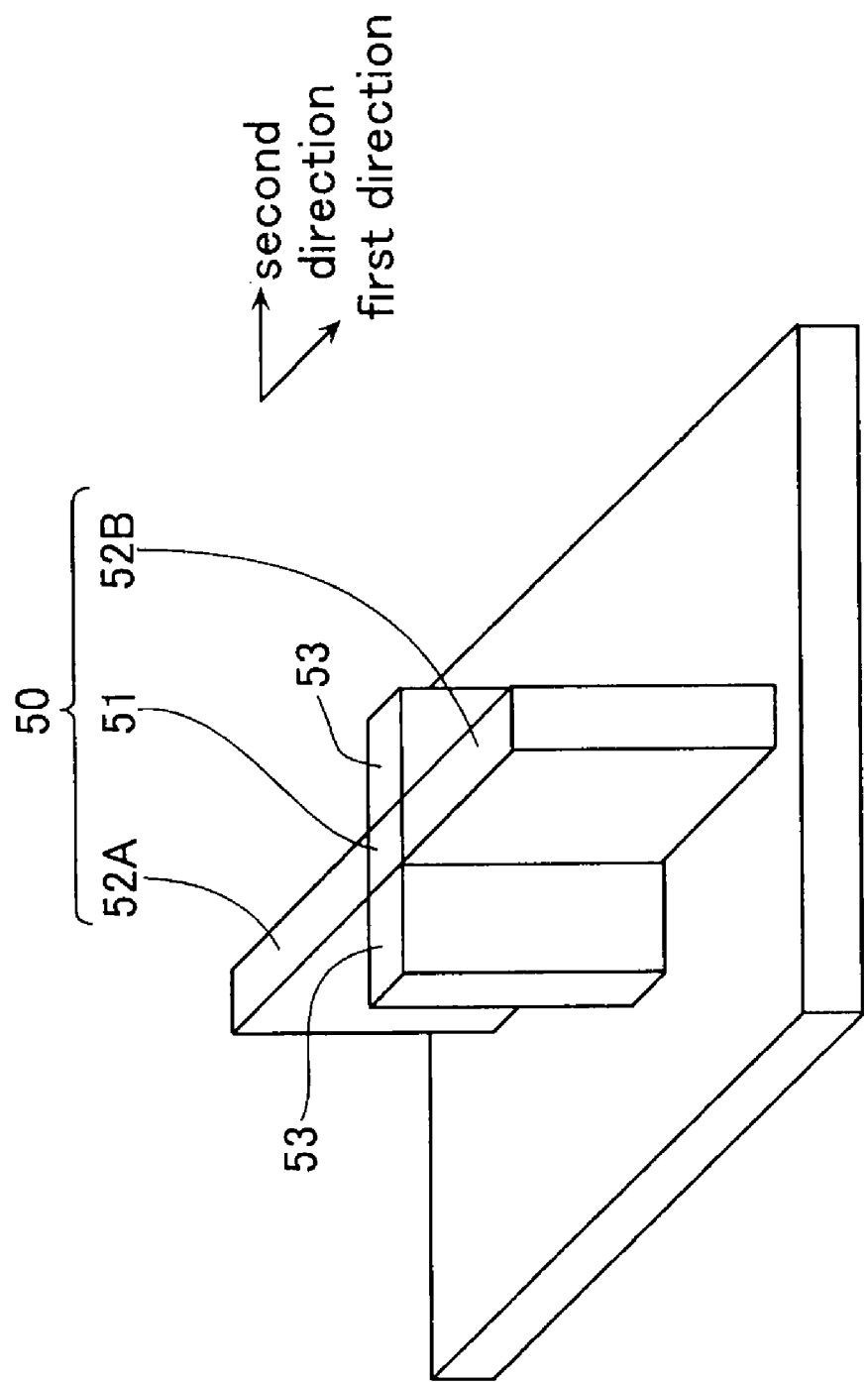
FIG. 2 is a circuit diagram showing a double gate FinFET.

In contrast, as shown in FIG. 2, the double gate FinFET is formed so that two separated gates may contact the channel. Consequently, since the double gate FinFET can adjust an amount of current that flows through the channel (operational threshold voltage of the FinFET) by use of the two gates 53, the operation threshold voltage of the FinFET can be set more carefully, compared with the case of the single gate FinFET.

Returning to FIG. 1A, description will be given.

The back gate of the transfer transistor 14 is connected to the node N10, and the back gate of the transfer transistor 15 is connected to the node N11.

The back gate of the driver transistor 16 and the back gate of the read transistor 17 are connected to a column selection line COL[p], to which a read voltage is applied when data is read from the memory cell MC (where p is a natural number). One column selection line COL[p] is formed in the second direction per bit line pair 30.

Figure 1B:
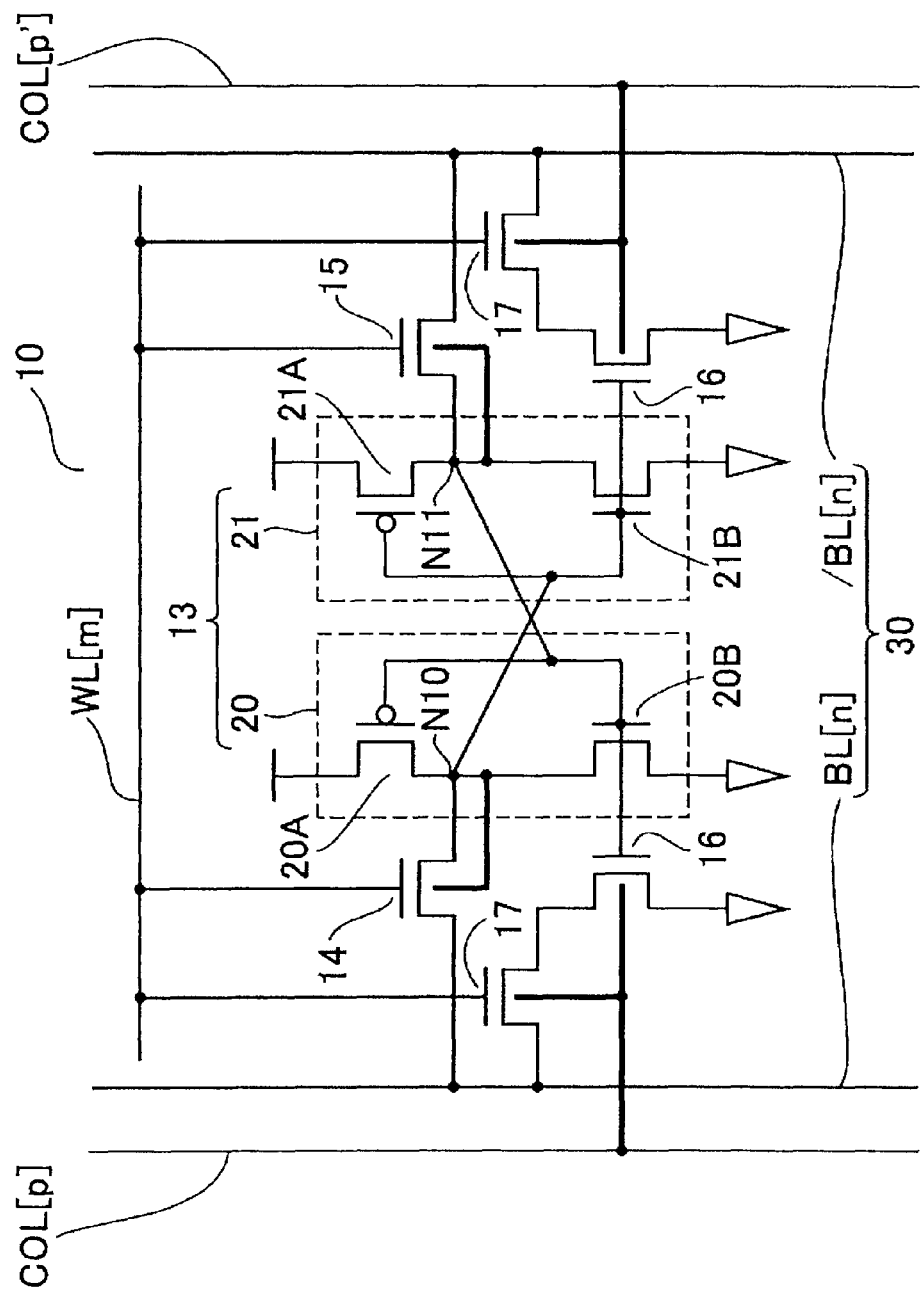
FIG. 1B is a diagram showing a configuration in which a driver transistor 16, a read transistor 17, and a column selection line COL of the SPAM are formed both on one bit line BL and on other bit line /BL.

Moreover, the driver transistor 16, the read transistor 17, and the column selection line COL[p] may be formed on the bit line /BL[n] side, and may be formed both on the bit line BL[n] side and the bit line /BL[n] side, as shown in FIG. 1B. In other words, the driver transistor 16, the read transistor 17, and the column selection line COL[p] may be formed not only on the inverter 20 side but also on the inverter 21 side. Accordingly, a gate of a second driver transistor 16 is connected to the node N10, and a gate of a second read transistor 17 is connected to the word line WL[m]. A drain of the second read transistor 17 is connected to the bit line /BL[n], and a source of the second read transistor 17 is connected to a drain of the second driver transistor 16. A ground voltage VSS is supplied to a source of the second driver transistor 16. Moreover, the second driver transistor 16 and the second read transistor 17 are also formed of the double gate FinFET, and a back gate of the second driver transistor 16 and that of the second read transistor 17 are connected to a column selection line COL [p'].

The number of the memory cells MC that constitute the SRAM according to the first embodiment is not limited to the number shown in FIG. 1A.

Figure 3:
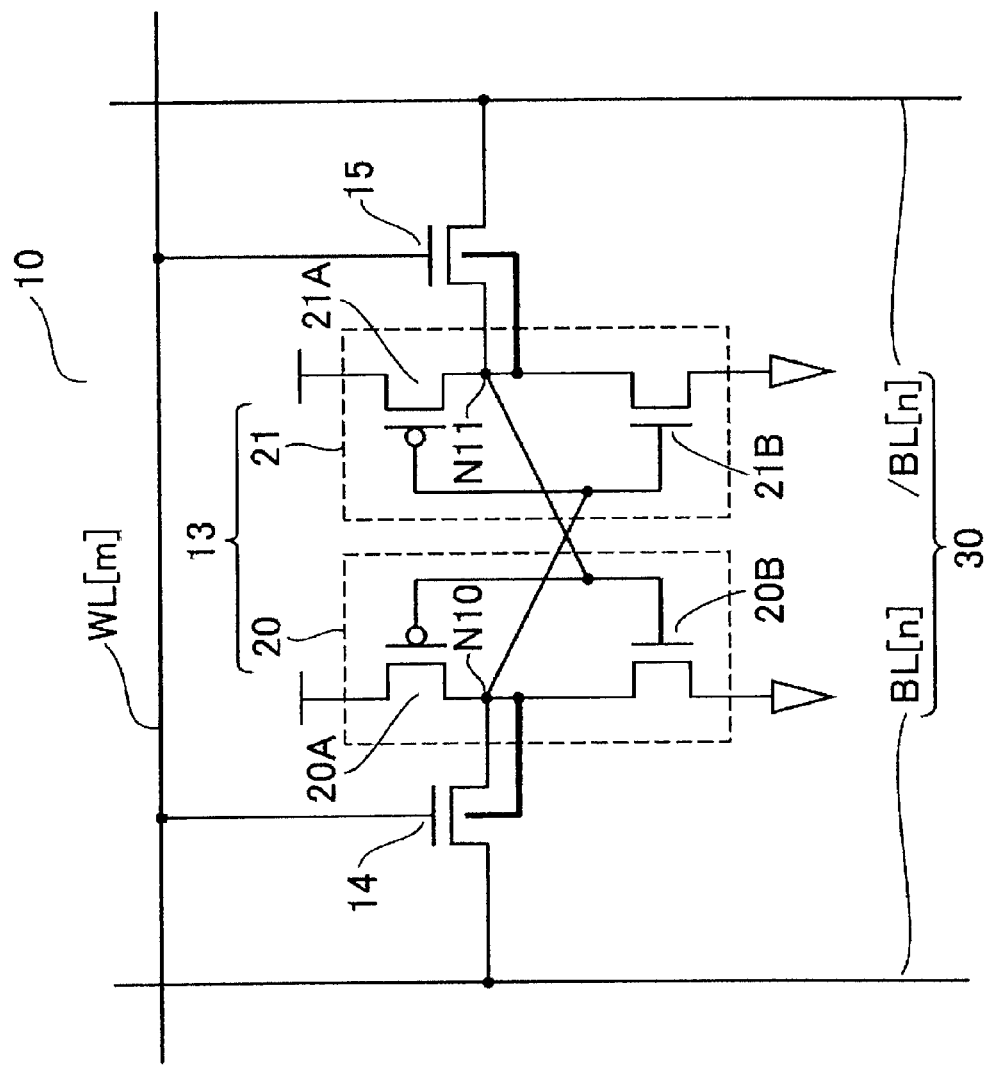
FIG. 3 is a circuit diagram in which the driver transistor 16, the read transistor 17, and the column selection line COL are eliminated from FIG. 1A.

Here, as shown in FIG. 3, description will be given of a case of providing a configuration in which the driver transistor 16, the read transistor 17, and the column selection line COL[p] are eliminated from a circuit configuration according to the first embodiment.

For example, when data "0" is stored in the node N10 and data "1" is stored in the node N11, a voltage of the data "0" is applied to the back gate of the transfer transistor 14. The voltage of the data "0", is defined as 0 V and a voltage of the data "1" is defined as 1 V. Since 0 V is applied to the back gate of the transfer transistor 14, a threshold voltage of the transfer transistor 14 rises. For that reason, in such a circuit as shown in FIG. 3, it takes time to transfer the data to the bit line BL[n] from the node N10, in which the data "0" is stored. The circuit of FIG. 3 has the problem mentioned.

Since the voltage of the data "1" is applied to the back gate of the transfer transistor 15, the threshold voltage of the transfer transistor 15 drops. Accordingly, the data transfer speed does not reduce.

In summary, in such a circuit as shown in FIG. 3, it takes a longer time to read the data "0."

In contrast, the SRAM according to the first embodiment includes the driver transistor 16, the read transistor 17, and the column selection line COL[p], as shown in FIG. 1A.

When the data "0" is stored in the node N10, the data "1" is stored in the node N11. Accordingly, the voltage of the data "1" is applied to the front gate of the driver transistor 16 so that the driver transistor 16 is conducted. Further, since a selection voltage SV is applied to the word line WL[m], the selection voltage SV is applied to the front gate of the read transistor 17 so that the read transistor 17 is also conducted.

Since a read voltage RV is applied to the column selection line COL[p], the read voltage RV is applied to the back gate of the driver transistor 16 and the back gate of the read transistor 17. For that reason, the threshold voltage of the driver transistor 16 and the threshold voltage of the read transistor 17 drop, making the driver transistor 16 and the read transistor 17 easy to be conducted. The selection voltage SV and the read voltage RV are a positive voltage, and for example, are 1 V.

In the first embodiment, when the data "0" stored in the node N10 is read, the ground voltage VSS connected to the source of the driver transistor 16 is read to the bit line BL[n] through the driver transistor 16 and the read transistor 17, not from the transfer transistor 14. Thereby, reduction of the reading speed can be prevented. Moreover, the read voltage RV is applied only to the column selection line COL[p] to which the select memory cell MC is connected. Accordingly, of the non-selected memory cells MC connected to the same word line WL as the selected memory cell MC is connected to, the memory cell MC having the data "0" stored in the node N10 has a high threshold voltage in the driver transistor 16 and the read transistor 17. Therefore, unnecessary read current that flows through the driver transistor 16 and the read transistor 17 can be reduced.

As mentioned above, according to the first embodiment, reduction of the reading speed of the select memory cell MC can be prevented, and unnecessary read current in the non-selected memory cell MC can be reduced.

Figure 4:
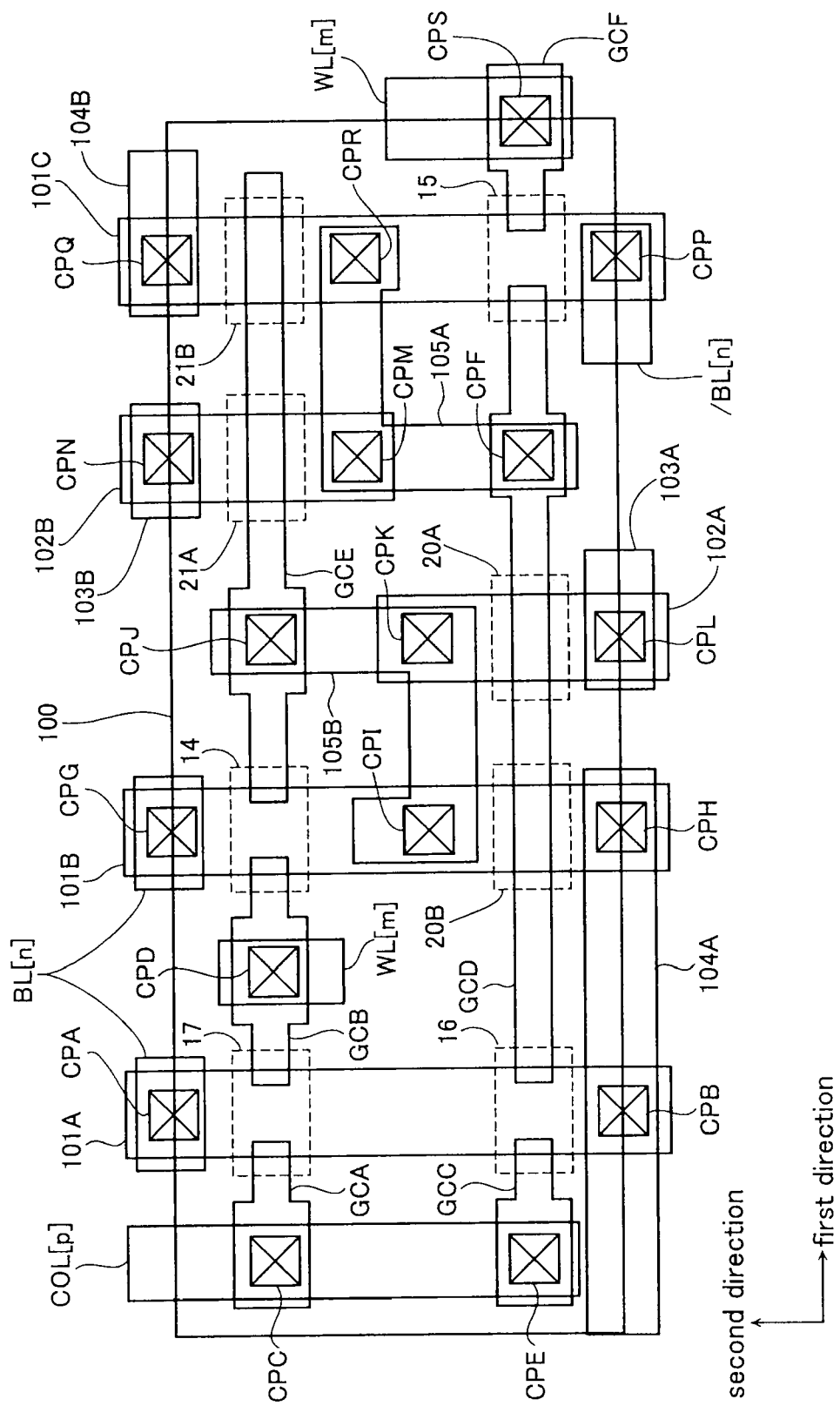
FIG. 4 is a partial plan view of the SRAM according to the first embodiment.

Next, using FIG. 4, description will be given on a layout of the memory cell MC that constitutes the SPAM according to the first embodiment. FIG. 4 is a plan view of the memory cell MC shown in FIG. 1A.

The memory cell MC includes n type diffusion layers 101A to 101C and p type diffusion layers 102A and 102B formed on a well 100 of a silicon substrate in the second direction. Moreover, gate contacts GCA to GCF are formed in the first direction so as to intersect with the diffusion layers 101 and 102. A plurality of N type diffusion layers 101 are referred to as 101A, 101B, . . . , and they are collectively referred to as 101, without A, B, . . . attached. Other components (102 to 105, GC, CP) are also referred to in the same manner.

The gate contact GC is formed, for example, of polysilicon. However, the present embodiment is not limited to that. Hereinafter, a layer in which the N type diffusion layer 101 and the P type diffusion layer 102 are formed is referred to as an active area. As mentioned above, the transistors that constitute the SRAM according to the first embodiment are formed of the single gate FinFET, and some of the transistors are formed of the double gate FinFET. In the single gate FinFET, the gate contact GC is formed so as to cover the diffusion layers 101 and 102. The double gate FinFET is formed so that the diffusion layer 101 or 102 may be sandwiched by different gate contacts GC from the right and left, as shown in FIG. 4.

The word line WL[m], the bit lines BL[n] and /BL[n], the column selection line COL[p], a VDD line 103, a VSS line 104, and a node combining contact 105 are formed on a first wiring layer on the active area. The first wiring layer is connected to the active area by a contact plug CP.

The gate contacts GCA to GCD are formed over the N type diffusion layer 101A. Moreover, one end of the N type diffusion layer 101A is connected to the bit line BL[n] through a contact plug CPA, and the other end thereof is connected to a VSS line 104A through a contact plug CPB.

The gate contacts GCA and GCB are formed on the same line in the first direction so as to sandwich the N type diffusion layer 101A therebetween. The gate contact GCA acts as the back gate of the read transistor 17, and the gate contact GCB acts as the front gate of the read transistor 17. Moreover, the gate contact GCA is connected to the column selection line COL[p] through a contact plug CPC, and the gate contact GCB is connected to the word line WL[m] through a contact plug CPD.

The gate contacts GCC and GCD are formed on the same line in the first direction so as to sandwich the N type diffusion layer 101A therebetween. The gate contact GCC acts as the back gate of the driver transistor 16, and the gate contact GCD acts as the front gate of the driver transistor 16. Moreover, the gate contact GCC is connected to the column selection line COL[p] through a contact plug CPE, and the gate contact GCD is connected to a node combining contact 105A through a contact plug CPF. The node combining contact 105A is the node N11 in the circuit.

On the N type diffusion layer 101A, the contact plug CPA, the gate contact GCA, the gate contact GCC, and the contact plug CPB are sequentially arranged so that a current path may be in series from the bit line BL[n] to the VSS 104A.

The gate contacts GCB, GCD, and GCE are formed over the N type diffusion layer 101B. Moreover, one end of the N type diffusion layer 101B is connected to the bit line BL[n] through a contact plug CPG, and the other end thereof is connected to the VSS line 104A through a contact plug CPH. Further, a node combining contact 105B is connected between the one end and the other end of the N type diffusion layer 101B through a contact plug CPI. The node combining contact 105B is the node N10 in the circuit.

The gate contacts GCB and GCE are formed on the same line in the first direction so as to sandwich the N type diffusion layer 101B. The gate contact GCB acts as the front gate of the transfer transistor 14, and the gate contact GCE acts as the back gate of the transfer transistor 14. The gate contact GCE is connected to the node combining contact 105B through a contact plug CPJ.

The gate contact GCD is formed in the first direction so as to cover the N type diffusion layer 101B, and acts as a gate of the nMOS transistor 20B within the inverter 20.

On the N type diffusion layer 101B, the contact plug CPG, the gate contact GCB, the contact plug CPI, the gate contact GCD, and the contact plug CPH are sequentially arranged so that the current path may be in series from the bit line BL[n] to the VSS 104A.

The gate contact GCD is formed over the P type diffusion layer 102A. Moreover, one end of the P type diffusion layer 102A is connected to the node combining contact 105B through a contact plug CPK, and the other end thereof is connected to a VDD line 103A through a contact plug CPL.

The gate contact GCD is formed in the first direction so as to cover the P type diffusion layer 102A, and acts as a gate of the pMOS transistor 20A within the inverter 20.

On the P type diffusion layer 102A, the contact plug CPL, the gate contact GCD, and the contact plug CPK are sequentially arranged so that a current path may be in series from the VDD line 103A to the node combining contact 105B.

The gate contact GCE is formed over the P type diffusion layer 102B. Moreover, one end of the P type diffusion layer 102B is connected to a node combining contact 105A through a contact plug CPM, and the other end thereof is connected to the VDD line 103B through a contact plug CPN.

The gate contact GCE is formed in the first direction so as to cover the P type diffusion layer 102B, and acts as a gate of the pMOS transistor 21A within the inverter 21.

On the P type diffusion layer 102B, the contact plug CPN, the gate contact GCE, and the contact plug CPM are sequentially arranged so that a current path may be in series from the VDD line 103B to the node combining contact 105A.

The gate contacts GCD to GCF are formed over the N type diffusion layer 101C. Moreover, one end of the N type diffusion layer 101C is connected to the bit line /BL[n] through a contact plug CPP, and the other end thereof is connected to a VSS line 104B through a contact plug CPQ. Further, the node combining contact 105A is connected to the N type diffusion layer 101C through a contact plug CPR between the ends of the N type diffusion layer 101C.

The gate contacts GCD and GCF are formed on the same line in the first direction so as to sandwich the N type diffusion layer 101C therebetween. The gate contact GCD acts as the back gate of the transfer transistor 15, and the gate contact GCF acts as the front gate of the transfer transistor 15. Moreover, the gate contact GCF is connected to the word line WL[m] through a contact plug CPS.

The gate contact GCE is formed in the first direction so as to cover the N type diffusion layer 101C, and acts as a gate of the nMOS transistor 21B within the inverter 21.

On the N type diffusion layer 101C, the contact plug CPP, the gate contact GCD, the contact plug CPR, the gate contact GCE, and the contact plug CPQ are sequentially arranged so that a current path may be in series from the bit line /BL[n] to the VSS 104B.

Figure 5A:
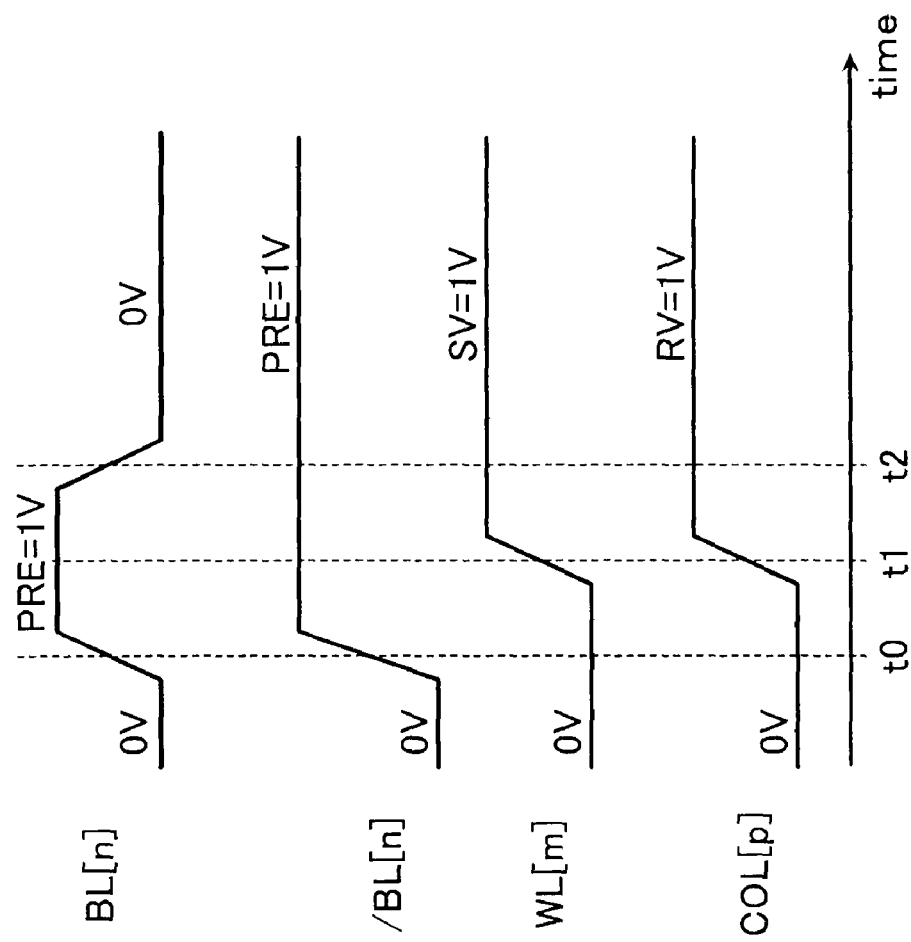
FIG. 5A is a timing chart of the SRAM according to the first embodiment at the time of reading.
Figure 5B:
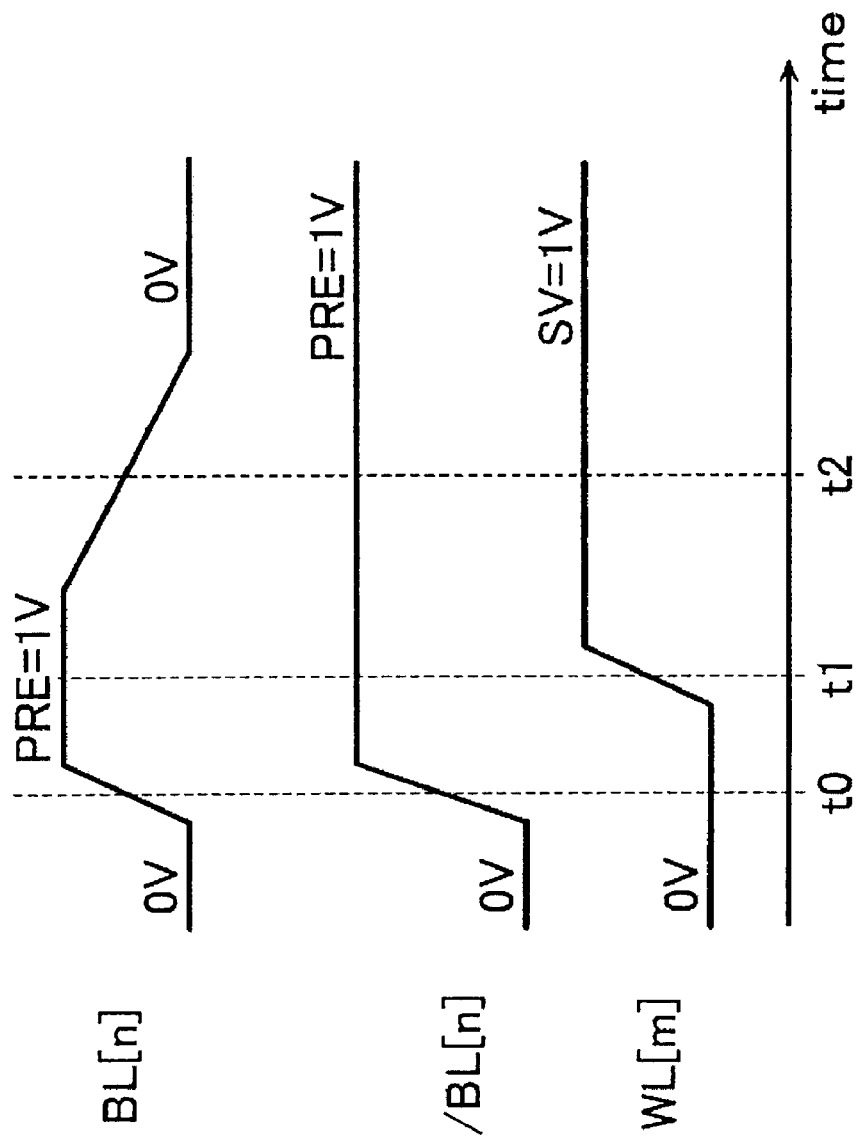
FIG. 5B is a timing chart of the SRAM having a configuration shown in FIG. 3 at the time of reading.

Next, a read operation of the SRAM according to the first embodiment will be described using FIG. 1A, FIG. 5A, and FIG. 5B. FIG. 5A is a timing chart at the time of reading in the first embodiment, and FIG. 5B is a timing chart at the time of reading in the circuit of FIG. 3.

Description will be given, as an example, of a case where the data "0" is stored in the node N10 within the memory cell MC shown in FIG. 1A and connected at the intersection of the word line WL[m] and the pair of bit lines BL[n] and /BL[n], and the data "1" is stored in the node N11.

As shown in FIG. 5A, at time t0, a precharge circuit not shown applies a precharge voltage PRE to the bit lines BL[n] and /BL[n], to which the memory cell MC is connected. The precharge voltage PRE is 1 V, for example.

Next, at time t1, a row decoder not shown applies a selection voltage SV to the word line WL[m], to which the memory cell MC is connected, and further, a column decoder not shown applies a read voltage RV to the column selection line COL[p]. The selection voltage SV and the read voltage RV are 1 V, for example.

Then, the transfer transistors 14 and 15 and the read transistor 17 are conducted by the selection voltage SV, the word line WL[m] being connected to the front gates of the transfer transistors 14 and 15. Since the voltage of the data "1" of the node N11 is applied to the gate of the driver transistor 16, the driver transistor 16 is conducted. As mentioned above, the ground voltage VSS connected to the source of the driver transistor 16 is read to the bit line BL[n], and the data of the node N11 is read to the bit line /BL[n].

As shown in FIG. 1A, the first embodiment includes the driver transistor 16 and the read transistor 17, and the back gate of the driver transistor 16 and that of the read transistor 17 are connected to the column selection line COL[p].

When the data "0" stored in the node N10 is read, the ground voltage VSS connected to the source of the driver transistor 16 is read to the bit line BL[n] through the driver transistor 16 and the read transistor 17.

Moreover, since the read voltage RV is applied to the column selection line COL[p] at the time of reading, the read voltage RV is applied to the back gate of the driver transistor 16 and that of the read transistor 17. Thereby, the driver transistor 16 and the read transistor 17 are easy to be conducted, in other words, are in a state where the data reading speed is high. Moreover, the read voltage RV is applied only to the column selection line COL[p] to which the select memory cell MC is connected. Accordingly, of the non-selected memory cells MC connected to the same word line WL as the selected memory cell MC is connected to, the memory cell MC having the data "0" stored in the node N10 has a high threshold voltage in the driver transistor 16 and the read transistor 17. Thereby, unnecessary read current that flows through the driver transistor 16 and the read transistor 17 can be reduced. Additionally, comparing the cases of FIGS. 5A and 5B, it is found that time t2 when a potential of the bit line BL[n] reduces along with data reading comes earlier in the case of FIG. 5A. Namely, the reading speed is higher.

As mentioned above, the first embodiment can reduce unnecessary read current in the non-selected memory cell MC, while preventing reduction of the reading speed of the selected memory cell MC.

Second Embodiment

Figure 6A:
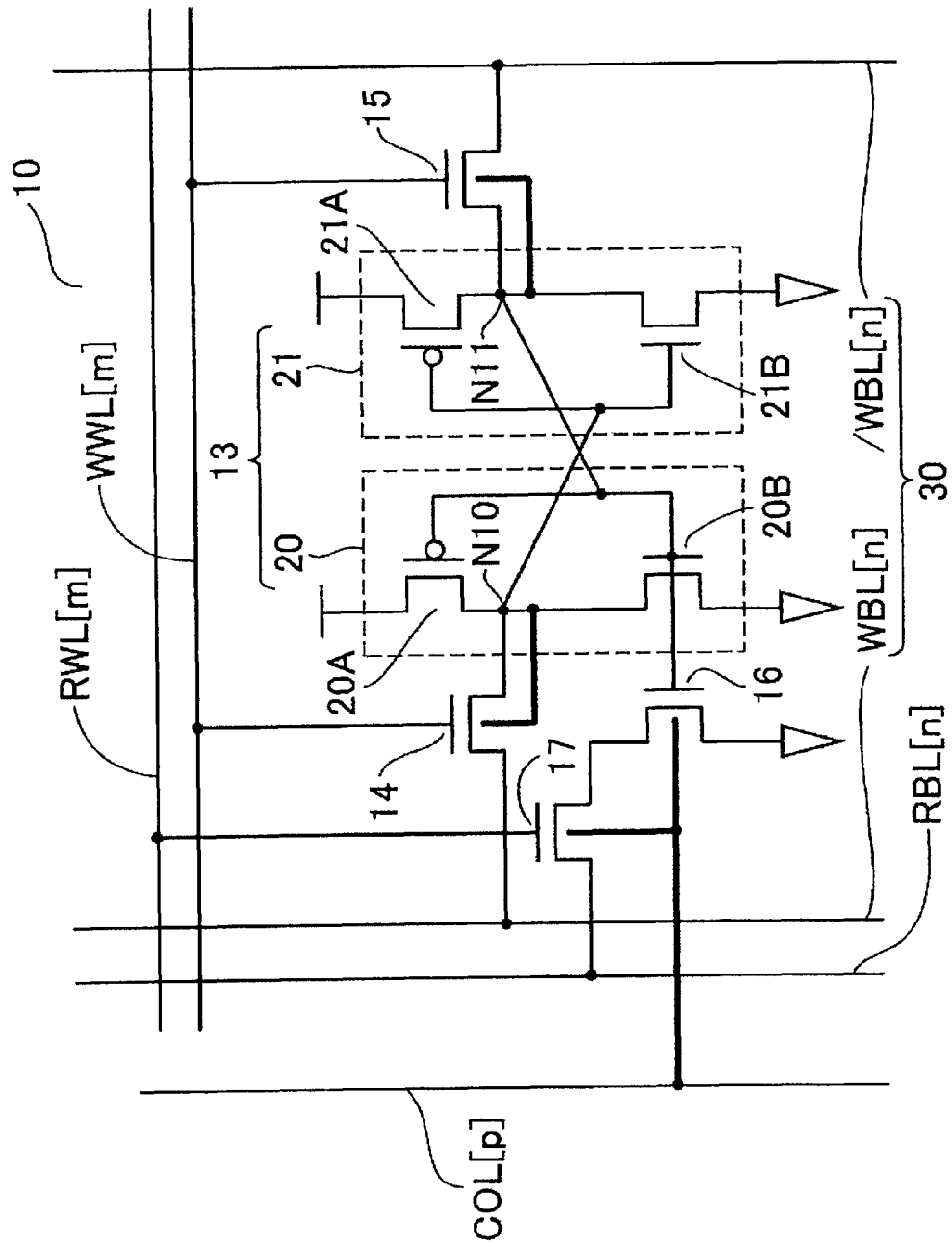
FIG. 6A is a circuit diagram showing a part of an SRAM according to a second embodiment.

FIG. 6A is an equivalent circuit diagram showing a part of an SRAM 10 according to a second embodiment of the present invention. As shown in FIG. 6A, the second embodiment has a configuration in which instead of the word line WL[m] and the bit line BL[n] in the first embodiment, two word lines WL[m] and two bit lines BL[n] are provided for writing and reading. Only this point is different from the first embodiment, and the other points are the same as those in the first embodiment. In FIG. 6A, the same reference numerals are given to the same portions as those in the first embodiment and the detailed description thereof will be omitted below.

Each of memory cells MC that constitute the SRAM 10 according to the second embodiment is formed at an intersection of a write word line WWL and a read word line RWL which are arranged in a first direction, and write bit lines WBL and a read bit line RBL which are arranged in a second direction. For convenience in description, FIG. 6A shows a memory cell MC formed at an intersection of a write word line WWL[m] and a pair of write bit lines WBL[n] and /WBL[n] (where m and n are natural numbers).

The memory cell MC has a data storage unit 13 formed by cross-coupling an inverter 20 to an inverter 21. The inverter 20 is formed by connecting a pMOS transistor 20A and an nMOS transistor 20B in series, while the inverter 21 is formed by connecting a pMOS transistor 21A and an nMOS transistor 21B in series. This point is the same as in the first embodiment.

Between the write bit line WBL[n] and an output terminal of the inverter 20, a transfer transistor 14 is formed for data transfer. Similarly, between the write bit line /WBL[n] and an output terminal of the inverter 21, a transfer transistor 15 is formed for data transfer.

The write word line WWL[m] is connected to a gate of the transfer transistor 14, and the write bit line WBL[n] is connected to a drain of the transfer transistor 14. A node N10 is connected to a source of the transfer transistor 14, the output terminal of the inverter 20 and the input terminal of the inverter 21. The write word line WWL[m] is connected to a gate of the transfer transistor 15, and the write bit line /WBL[n] is connected to a drain of the transfer transistor 15. A node N11 is connected to a source of the transfer transistor 15, the output terminal of the inverter 21 and the input terminal of the inverter 20.

Further, a gate of a driver transistor 16 is connected to the node N11, and a gate of a read transistor 17 is connected to the read word line RWL[m]. The read bit line RBL[n] is connected to a drain of the read transistor 17, and a source of the read transistor 17 is connected to a drain of the driver transistor 16. A ground voltage VSS is supplied to a source of the driver transistor 16.

Transistors that constitute the memory cells MC within the SRAM according to the second embodiment are formed of a single gate FinFET, while only the transfer transistors 14 and 15, the driver transistor 16, and the read transistor 17 are formed of a double gate FinFET. However, the driver transistor 16 may be the single gate FinFET instead of the double gate FinFET.

A back gate of the transfer transistor 14 is connected to the node N10, and a back gate of the transfer transistor 15 is connected to the node N11.

A back gate of the driver transistor 16 and that of the read transistor 17 are connected to a column selection line COL[p], to which a read voltage is applied when data is read from the memory cell MC (where p is a natural number). One column selection line COL[p] is formed in the second direction per write bit line pair 30.

Figure 6B:
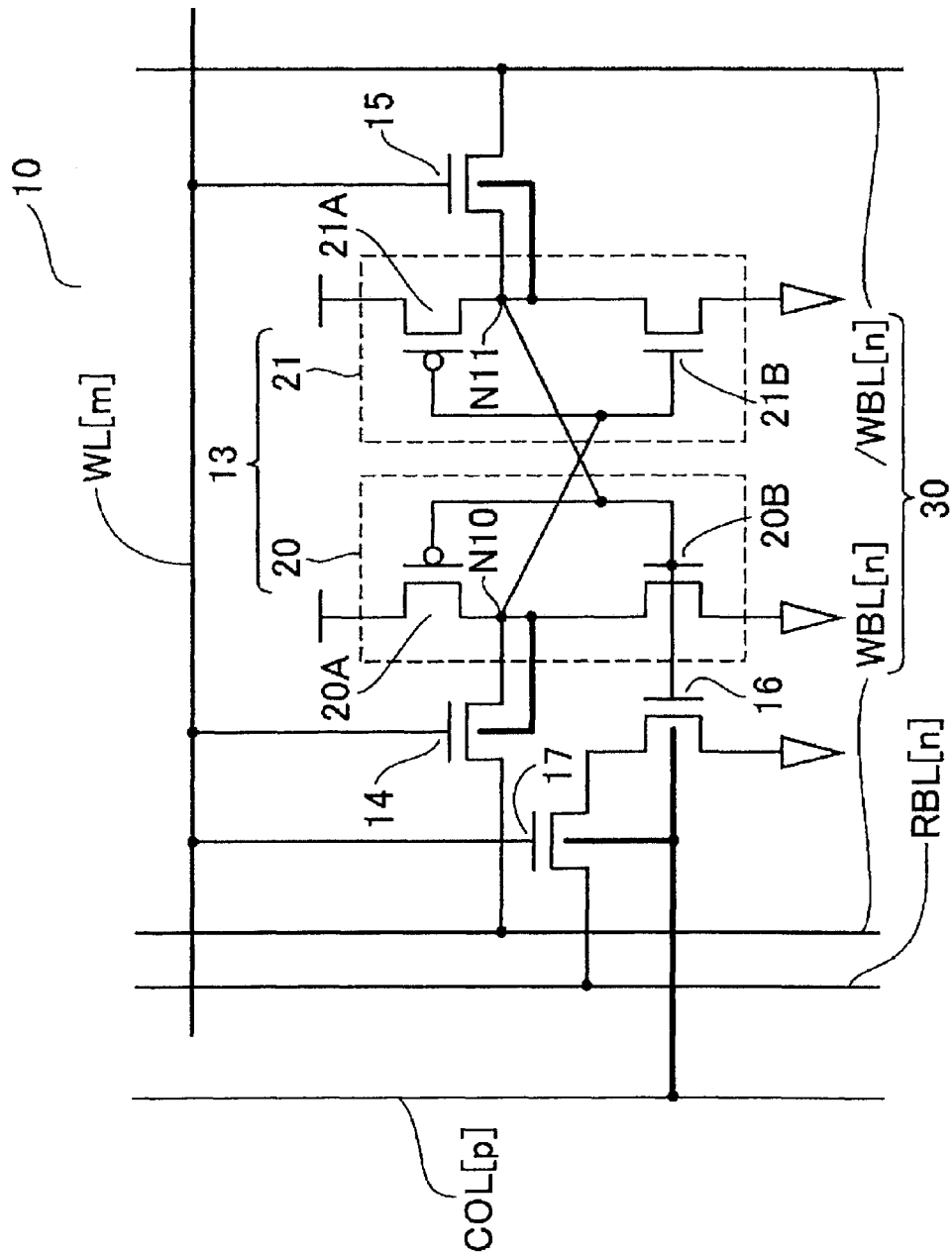
FIG. 6B is a circuit diagram showing a configuration in which only a bit line of the SRAM is divided into a read bit line and a write bit line.
Figure 6C:
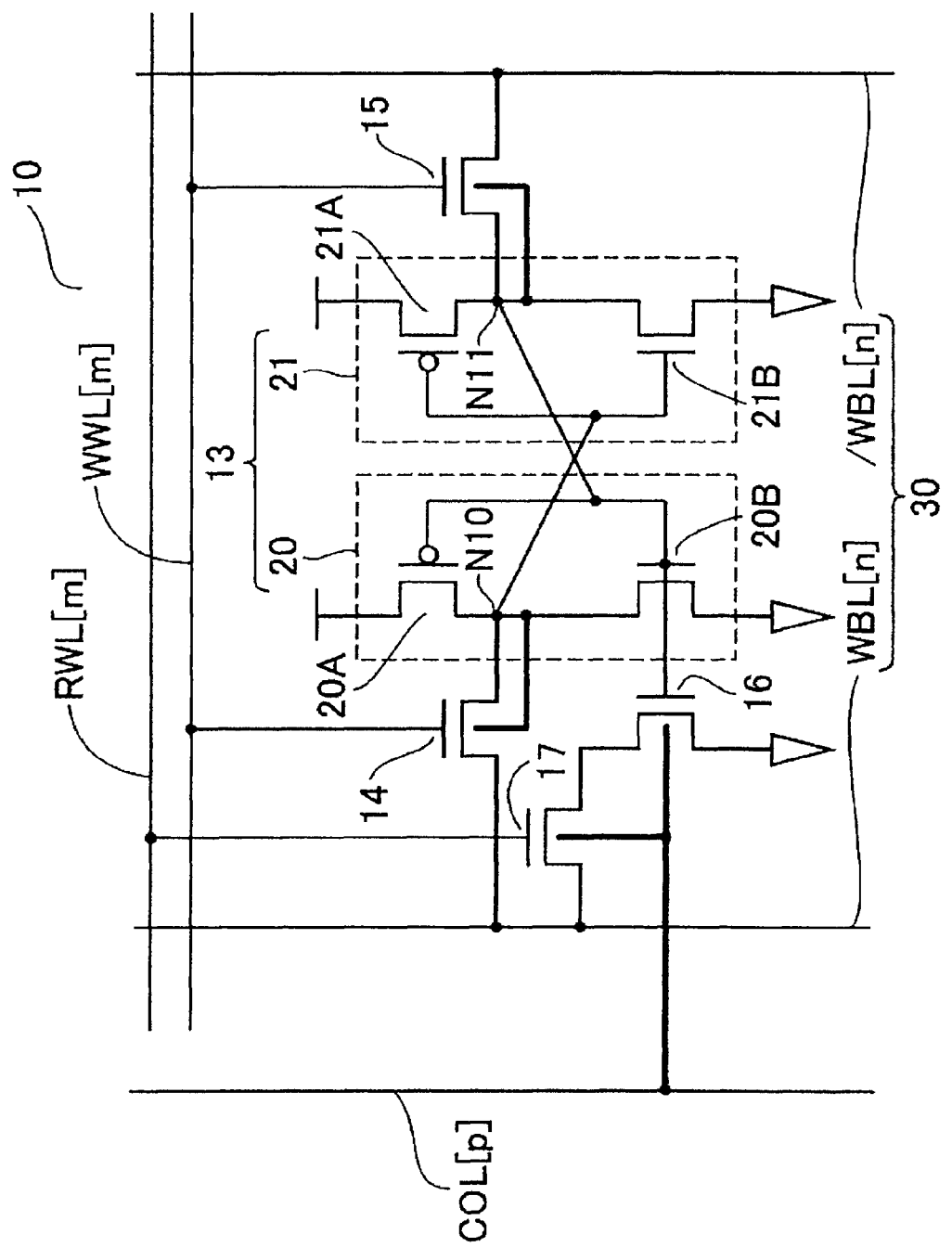
FIG. 6C is a circuit diagram showing a configuration in which only a word line of the SRAM is divided into a read word line and a write word line.

As shown in FIG. 6B, only the bit line BL may be divided into two to provide a write bit line and a read bit line, and only one word line WL may be provided (used for both reading and writing). Alternatively, as shown in FIG. 6C, only the word line WL may be divided into two to provide a write word line and a read word line, and only one bit line BL may be provided (used for both reading and writing). In an operation description part, description will be given on effects of the respective configurations mentioned above.

It is also possible to provide a pair of read bit lines RBL[n] and /RBL[n] for one memory cell MC. In this case, the driver transistor 16, the read transistor 17, and the column selection line COL[p] may be formed on the read bit line /RBL[n] side. Further, similarly to the example shown in FIG. 1B, a first driver transistor 16, a first read transistor 17, and a column selection line COL[p] may be formed both on the read bit line RBL[n] side and on the read bit line /RBL[n] side (the first driver transistor 16, the first read transistor 17, and the column selection line COL[p] can be provided on the read bit line RBL[n] side, and simultaneously, a second driver transistor 16, a second read transistor 17, and a second column selection line COL[p'] can also be provided on the read bit line side /RBL[n] side). In other words, the driver transistor 16, the read transistor 17, and the column selection line COL[p] may be formed not only on the inverter 20 side but also on the inverter 21 side. In this case, a gate of the second driver transistor 16 is connected to the node N10, and a gate of the second read transistor 17 is connected to the word line WL[m]. The read bit line /RBL[n] is connected to a drain of the second read transistor 17, and a source of the second read transistor 17 is connected with a drain of the second driver transistor 16. A ground voltage VSS is supplied to a source of the second driver transistor 16. The second driver transistor 16 and the second read transistor 17 are also formed of the double gate FinFET, and a back gate thereof is connected to the second column selection line COL[p'].

Figure 7:
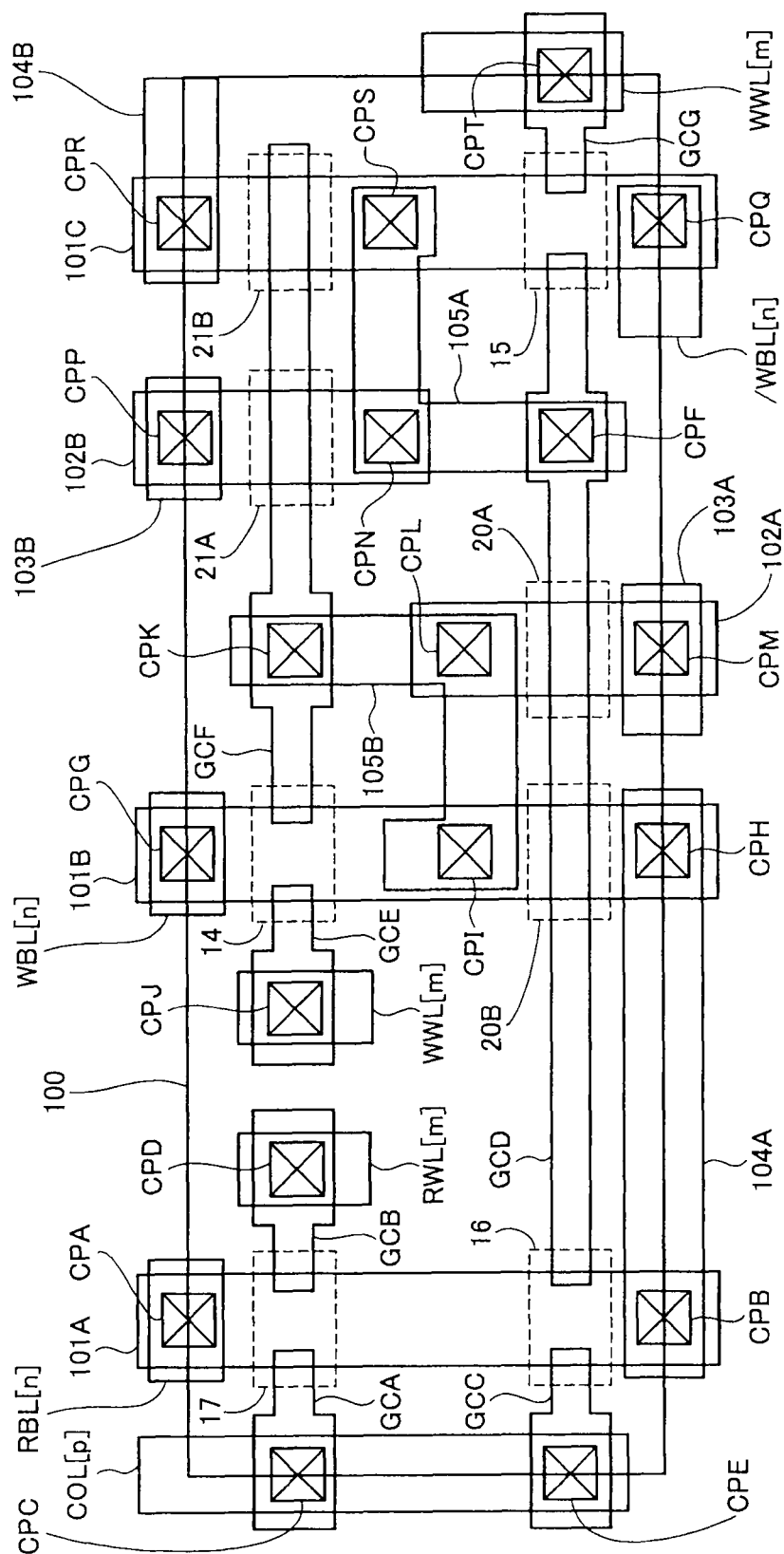
FIG. 7 is a partial plan view of the SPAM according to the second embodiment.

Next, using FIG. 7, description will be given on a layout of the memory cell MC that constitutes the SEAM according to the second embodiment. FIG. 7 is a plan view of the memory cell MC shown in FIG. 6A. In FIG. 7, the same reference numerals will be given to the same portions as those in the first embodiment, and the detailed description thereof will be omitted below.

The memory cell MC has N type diffusion layers 101A to 101C and P type diffusion layers 102A and 102B formed in the second direction on a well 100 of a silicon substrate. Gate contacts GCA to GCG are formed in the first direction so as to intersect with the diffusion layers 101 and 102. A plurality of N type diffusion layers 101 are referred to as 101A, 101B, ..., and they are collectively referred to as 101, without A, B, ... attached. Other components (102 to 105, GC, CP) are also referred to in the same manner.

The gate contact GC is formed, for example, of polysilicon. However, the present embodiment is not limited to that. Hereinafter, a layer in which the N type diffusion layer 101 and the P type diffusion layer 102 are formed is referred to as an active area. As mentioned above, the transistors that constitute the SRAM according to the second embodiment are formed of the single gate FinFET, and only some of the transistors are formed of the double gate FinFET. In the single gate FinFET, the gate contact GC is formed so as to cover the diffusion layers 101 and 102. The double gate FinFET is formed so that the diffusion layer 101 or 102 may be sandwiched by different gate contacts GC from the right and left, as shown in FIG. 2. These points are the same as those in the first embodiment.

On a first wiring layer on the active area, the write word line WWL[m] and the read word line RWL[m], the write bit lines WBL[n] and /WBL[n], the read bit line RBL[n], the column selection line COL[p], a VDD line 103, a VSS line 104, and a node combining contact 105 are formed. The first wiring layer is connected to the active area by a contact plug CP.

The gate contacts GCA to GCD are formed over the N type diffusion layer 101A. Moreover, one end of the N type diffusion layer 101A is connected to the read bit line RBL[n]

through a contact plug CPA, and the other end thereof is connected to a VSS line 104A through a contact plug CPB.

The gate contacts GCA and GCB are formed on the same line in the first direction so as to sandwich the N type diffusion layer 101A therebetween. The gate contact GCA acts as the back gate of the read transistor 17, and the gate contact GCB acts as a front gate of the read transistor 17. Moreover, the gate contact GCA is connected to the column selection line COL[p] through a contact plug CPC, and the gate contact GCB is connected to the read word line RWL[m] through a contact plug CPD.

The gate contacts GCC and GCD are formed on the same line in the first direction so as to sandwich the N type diffusion layer 101A therebetween. The gate contact GCC acts as the back gate of the driver transistor 16, and the gate contact GCD acts as the front gate of the driver transistor 16. Moreover, the gate contact GCC is connected to the column selection line COL[p] through a contact plug CPE, and the gate contact GCD is connected to a node combining contact 105A through a contact plug CPF. The node combining contact 105A is the node N11 in the circuit.

On the N type diffusion layer 101A, the contact plug CPA, the gate contact GCA, the gate contact GCC, and the contact plug CPB are sequentially arranged so that a current path may be in series from the read bit line RBL[n] to the VSS 104A.

Gate contacts GCD to GCF are formed over the N type diffusion layer 101B. Moreover, one end of the N type diffusion layer 101B is connected to the write bit line WBL[n] through a contact plug CPG, and the other end thereof is connected to the VSS line 104A through a contact plug CPH. Further, a node combining contact 105B is connected to the N type diffusion layer 101B through a contact plug CPI between the ends of the N type diffusion layer 101B. The node combining contact 105B is the node N10 in the circuit.

The gate contacts GCE and GCF are formed on the same line in the first direction so as to sandwich the N type diffusion layer 101B therebetween. The gate contact GCE acts as the front gate of the transfer transistor 14, and the gate contact GCF acts as the back gate of the transfer transistor 14. Moreover, the gate contact GCE is connected to the write word line WWL[m] through a contact plug CPJ, and the gate contact GCF is connected to the node combining contact 105B through a contact plug CPK.

The gate contact GCD is formed in the first direction so as to cover the N type diffusion layer 101B, and acts as the gate of the nMOS transistor 20B within the inverter 20.

On the N type diffusion layer 101B, the contact plug CPG, the gate contact GCE, the contact plug CPI, the gate contact GCD, and the contact plug CPH are sequentially arranged so that a current path may be in series from the write bit line WBL[n] to the VSS 104A.

The gate contact GCD is formed over the P type diffusion layer 102A. Moreover, one end of the P type diffusion layer 102A is connected to the node combining contact 105B through a contact plug CPL, and the other end thereof is connected to the VDD line 103A through a contact plug CPM.

The gate contact GCD is formed in the first direction so as to cover the P type diffusion layer 102A, and acts as the gate of the PMOS transistor 20A within the inverter 20.

On the P type diffusion layer 102A, the contact plug CPM, the gate contact GCD, and the contact plug CPL are sequentially arranged so that a current path may be in series from the VDD line 103A to the node combining contact 105B.

The gate contact GCF is formed over the P type diffusion layer 102B. Moreover, one end of the P type diffusion layer 102B is connected to the node combining contact 105A through a contact plug CPN, and the other end thereof is connected to the VDD line 103B through a contact plug CPP. The gate contact GCF is formed in the first direction so as to cover the P type diffusion layer 102B, and acts as the gate of the PMOS transistor 21A within the inverter 21.

On the P type diffusion layer 102B, the contact plug CPP, the gate contact GCF, and the contact plug CPN are sequentially arranged so that a current path may be in series from the VDD line 103B to the node combining contact 105A.

The gate contacts GCD, GCF, and GCG are formed over the N type diffusion layer 101C. Moreover, one end of the N type diffusion layer 101C is connected to the write bit line /WBL[n] through a contact plug CPQ, and the other end thereof is connected to the VSS line 104B through a contact plug CPR. Further, the node combining contact 105A is connected to the n type diffusion layer 101c through a contact plug CPS between the ends of the N type diffusion layer 101C.

The gate contacts GCD and GCG are formed on the same line in the first direction so as to sandwich the N type diffusion layer 101C therebetween. The gate contact GCD acts as the back gate of the transfer transistor 15, and the gate contact GCG acts as the front gate of the transfer transistor 15. Moreover, the gate contact GCG is connected to the write word line WWL[m] through a contact plug CPT.

The gate contact GCF is formed in the first direction so as to cover the N type diffusion layer 101C, and acts as the gate of the nMOS transistor 21B within the inverter 21.

On the N type diffusion layer 101C, the contact plug CPQ, the gate contact GCD, the contact plug CPS, the gate contact GCF, and the contact plug CPR are sequentially arranged so that a current path may be in series from the write bit line /WBL[n] to the VSS 104B.

Figure 8:
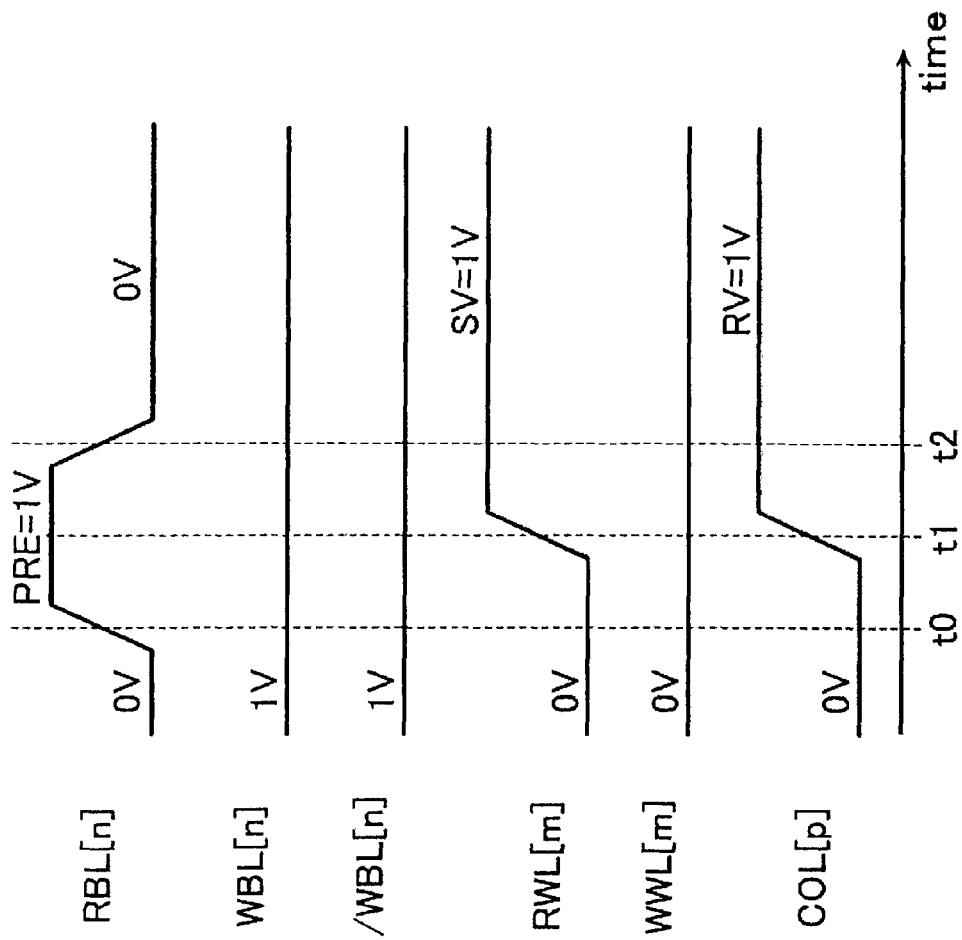
FIG. 8 is a timing chart of the SRAM according to the second embodiment at the time of reading.

Next, a read operation of the SRAM according to the second embodiment will be described, using FIGS. 6A and 8. FIG. 8 is a timing chart at the time of reading in the second embodiment. FIG. 8 shows a case where data "0" is stored in the node N10 and data "1" is stored in the node N11 within the memory cell MC.

As an example, description will be given of a case of reading the data of the memory cell MC connected to the intersection of the read word line RWL[m] and the read bit line RBL[n] shown in FIG. 6A.

As shown in FIG. 8, at time t0, a precharge circuit not shown applies a precharge voltage PRE to the read bit line RBL[n], to which the memory cell MC is connected. The precharge voltage PRE is 1 V, for example. As shown in FIG. 8, 0 V is applied to the write word line WWL[m]. Accordingly, in the second embodiment, the write bit line WBL[n] and /WBL[n] are completely disconnected from the data storage unit 13 at the time of reading.

Next, at time t1, a row decoder not shown applies a selection voltage SV to the read word line RWL[m], to which the memory cell MC is connected. Further, a column decoder not shown applies a read voltage RV to the column selection line COL[p]. The selection voltage SV and the read voltage RV are 1 V, for example. As shown in FIG. 8, the read voltage is not applied to the write word line WWL[m]. Accordingly, in the second embodiment, since the transfer transistors 14 and 15 are not conducted at the time of reading, read disturbance of selected and non-selected memory cells MC can be prevented.

Next, the read transistor 17 is conducted by the selection voltage SV. Here, the read word line RWL[m] is connected to the gate of the read transistor 17. When the data "0" is stored in the node N10, the driver transistor 16 is conducted. Therefore, a potential of the read bit line RBL[n] is a potential of the VSS. On the other hand, when the data "1" is stored in the node N10, the driver transistor 16 is not conducted. Therefore, the read bit line RBL[n] is in a high impedance state, with a precharge voltage PRE maintained.

Similarly to the case of the first embodiment, the second embodiment includes the driver transistor 16, the read transistor 17, and the column selection line COL[p]. Accordingly, when the data "0" stored in the node N10 is read, the ground voltage VSS connected to the source of the driver transistor 16 is read to the bit line BL[n] through the driver transistor 16 and the read transistor 17. Thereby, reduction of the reading speed can be prevented.

As mentioned above, in addition to the effects obtained in the first embodiment, the second embodiment can prevent read disturbance of the selected and the non-selected memory cells MC.

When only the bit line BL as shown in FIG. 6B is divided into the read bit line BL and the write bit line BL, the same effects as those in the first embodiment can be obtained. Moreover, when only the word line WL as shown in FIG. 6C is divided into the read word line WL and the write word line WL, in addition to the effects obtained in the first embodiment, read disturbance of the non-selected memory cell MC can be prevented in the same manner as in the case of FIG. 6A.

Third Embodiment

Figure 9:
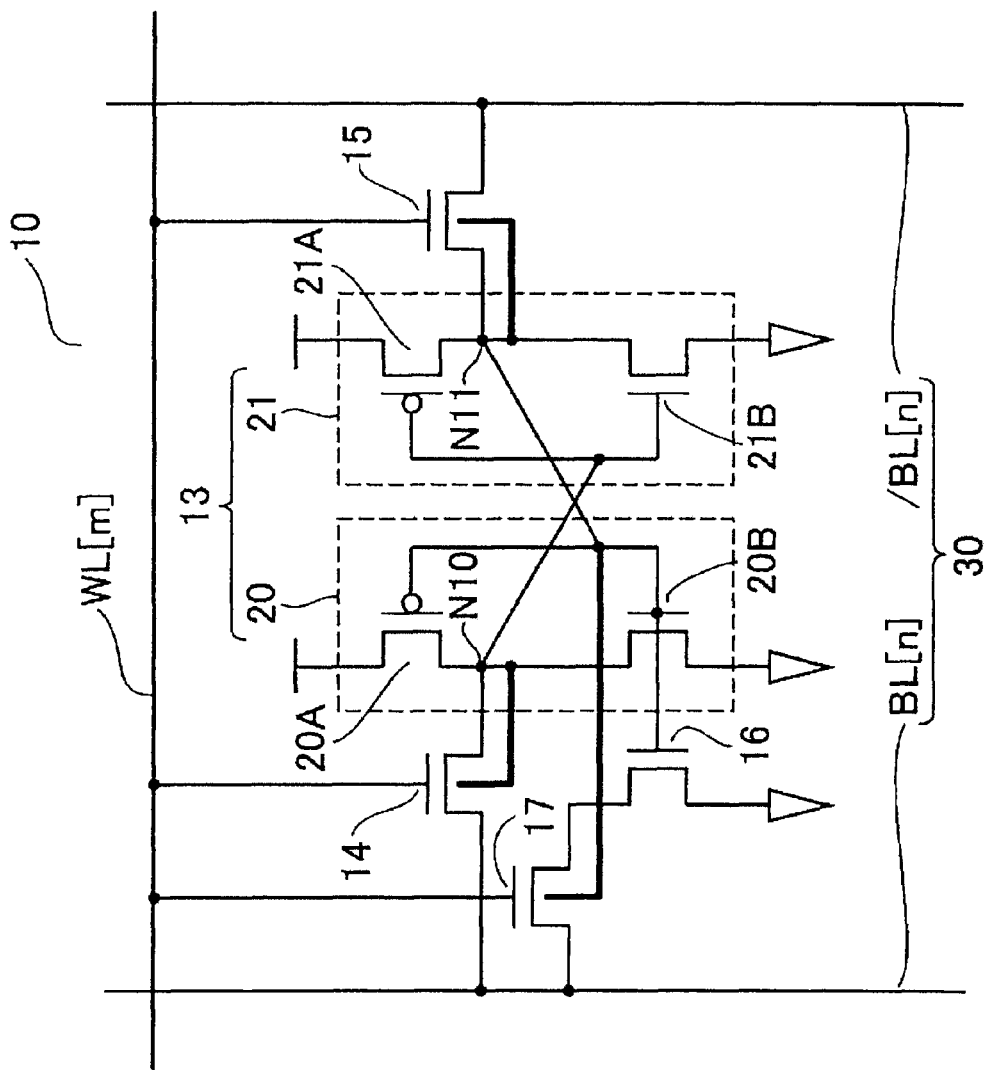
FIG. 9 is a circuit diagram showing a part of an SRAM according to a third embodiment.

FIG. 9 is an equivalent circuit diagram showing a part of the SRAM 10 according to a third embodiment of the present invention. Unlike the first embodiment, the third embodiment has no column selection line COL, as shown in FIG. 9. Moreover, a third embodiment has a configuration in which a back gate of a read transistor 17 is connected to a node N11, and a driver transistor 16 is formed of a single gate FinFET. Only these points are different from those in the first embodiment, and the other points are the same as those in the first embodiment. In FIG. 9, the same reference numerals are given to the same portions as those in the first embodiment, and the detailed description will be omitted below.

Memory cells MC that constitute the SRAM 10 according to the third embodiment are formed at intersections of a plurality of word lines WL arranged in a first direction and a plurality of bit lines BL arranged in a second direction. For convenience in description, FIG. 9 shows a memory cell MC formed at an intersection of a word line WL[m] and a pair of bit lines BL[n] and /BL[n] (however, m and n are natural numbers).

The memory cell MC has a data storage unit 13 formed between a bit line pair 30 consisting of the bit line BL[n] and the bit line /BL[n] and formed by cross-coupling an inverter 20 to an inverter 21. The inverter 20 is formed by connecting a pMOS transistor 20A and an nMOS transistor 20B in series, and the inverter 21 is formed by connecting a PMOS transistor 21A and an nMOS transistor 21B in series.

Between the bit line BL[n] and an output terminal of the inverter 20, a transfer transistor 14 is formed for data transfer. Similarly, between the bit line /BL[n] and an output terminal of the inverter 21, a transfer transistor 15 is formed for data transfer. The word line WL[m] is connected to a gate of the transfer transistor 14, and the bit line BL[n] is connected to a drain of the transfer transistor 14. A node N10 is connected to a source of the transfer transistor 14, the output terminal of the inverter 20 and an input terminal of the inverter 21. The word line WL[m] is connected to a gate of the transfer transistor 15, and the bit line /BL[n] is connected to a drain of the transfer transistor 15. A node N11 is connected to a source of the transfer transistor 15, the output terminal of the inverter 21 and an input terminal of the inverter 20.

Further, a gate of a driver transistor 16 is connected to the node N11, and a gate of a read transistor 17 is connected to the word line WL[m]. The bit line BL[n] is connected to a drain of the read transistor 17, and a source of the read transistor 17 is connected to a drain of the driver transistor 16. A ground voltage VSS is supplied to a source of the driver transistor 16. These points are the same as those in the first embodiment.

Transistors that constitute the memory cells MC within the SRAM according to the third embodiment are formed of a single gate FinFET. Only the transfer transistors 14 and 15 and the read transistor 17 are formed of a double gate FinFET.

A back gate of the transfer transistor 14 is connected to the node N10, and a back gate of the transfer transistor 15 and that of the read transistor 17 is connected to the node N11.

The driver transistor 16 and the read transistor 17 may be formed on the bit line /BL[n] side. Further, similarly to the example shown in FIG. 1B, the driver transistor 16 and the read transistor 17 may be formed both on the bit line BL[n] side and on the bit line /BL[n] side. In other words, the driver transistor 16 and the read transistor 17 may be formed not only on the inverter 20 side but on the inverter 21 side. Accordingly, a gate of a second driver transistor 16 is connected to the node N10, and a gate of a second read transistor 17 is connected to the word line WL[m]. The bit line /BL[n] is connected to a drain of the second read transistor 17, and a source of the second read transistor 17 is connected to a drain of the second driver transistor 16. A ground voltage VSS is supplied to a source of the second driver transistor 16. Moreover, the second driver transistor and the second read transistor are also formed of a double gate FinFET.

The number of the memory cells MC that constitute the SRAM according to the third embodiment is not limited to the number shown in FIG. 9.

Figure 10:
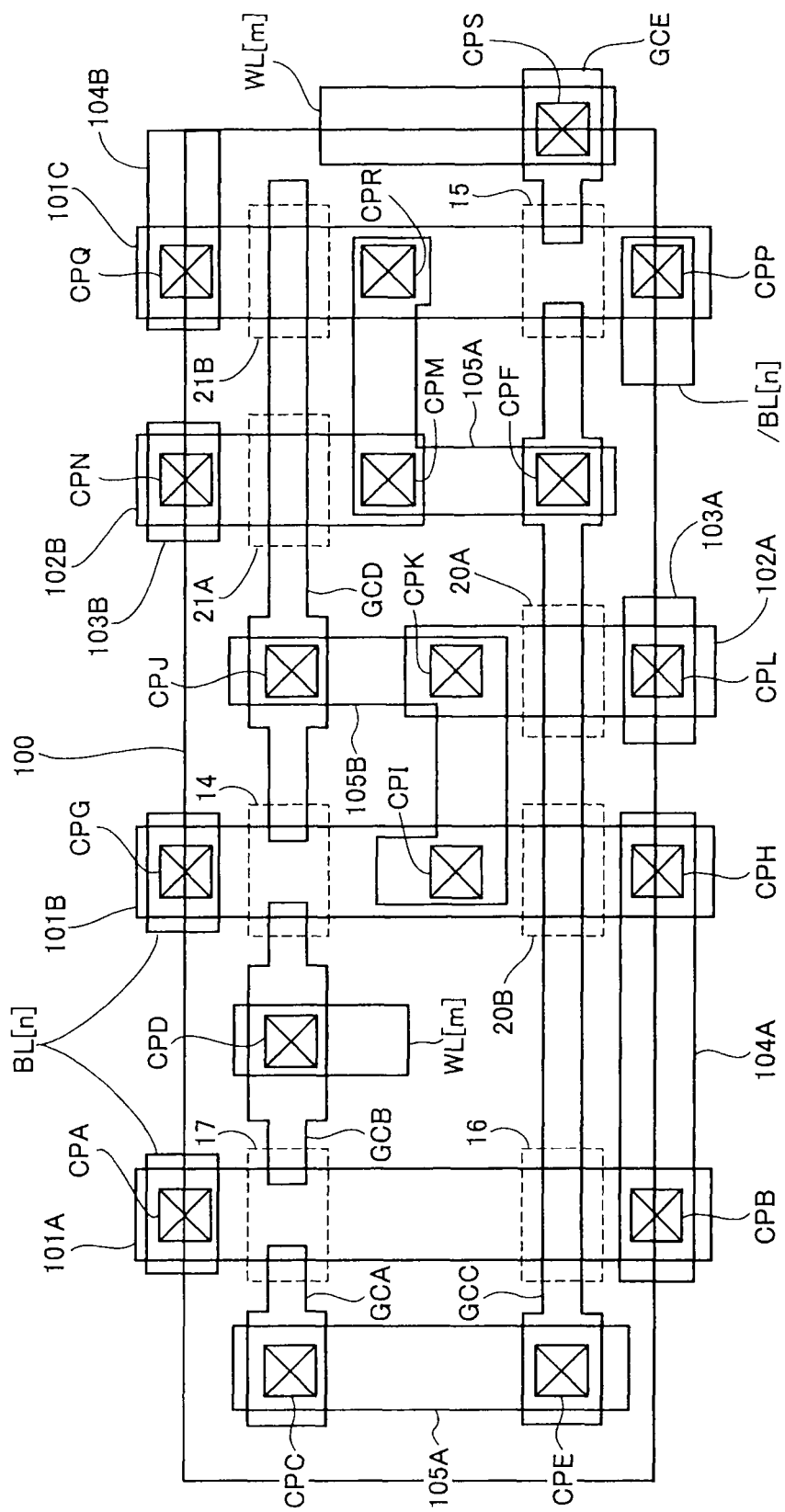
FIG. 10 is a partial plan view of the SRAM according to the third embodiment.

Next, using FIG. 10, description will be given on a layout of the memory cell MC that constitutes the SRAM according to the third embodiment. FIG. 10 is a plan view of the memory cell MC shown in FIG. 9. In FIG. 10, the same reference numerals are given to the same portions as those in the first embodiment, and the detailed description thereof will be omitted below.

The memory cell MC has N type diffusion layers 101A to 101C and P type diffusion layers 102A and 102B formed on a well 100 of a silicon substrate in the second direction. Moreover, gate contacts GCA to GCE are formed in the first direction so as to intersect with the diffusion layers 101 and 102. A plurality of N type diffusion layers 101 are referred to as 101A, 101B, ..., and they are collectively referred to as 101, without A, B, ... attached. Other components (102 to 105, GC, CP) are also referred to in the same manner.

The gate contact GC is formed, for example, of polysilicon. However, the present embodiment is not limited to that. Hereinafter, a layer in which the N type diffusion layer 101 and the P type diffusion layer 102 are formed is referred to as an active area. As mentioned above, the transistors constituting the SRAM according to the third embodiment are formed of the single gate FinFET, and only some of the transistors are formed of the double gate FinFET. In the single gate FinFET, the gate contact GC is formed so as to cover the diffusion layers 101 and 102. The double gate FinFET is formed so that the diffusion layer 101 or 102 may be sandwiched by different gate contacts GC from the right and left, as shown in FIG. 2. These points are the same as those in the first embodiment.

On a first wiring layer on the active area, the word line WL[m], the bit lines BL[n] and /BL[n], a VDD line 103, a VSS line 104, a node combining contact 105 are formed. The first wiring layer is connected to the active area by a contact plug CP.

The gate contacts GCA to GCC are formed over the N type diffusion layer 101A. Moreover, one end of the N type diffusion layer 101A is connected to the bit line BL[n] through a contact plug CPA, and the other end of the N type diffusion layer 101A is connected to the VSS line 104A through a contact plug CPB.

The gate contacts GCA and GCB are formed on the same line in the first direction so as to sandwich the N type diffusion layer 101A therebetween. The gate contact GCA acts as a back gate of the read transistor 17, and the gate contact GCB acts as a front gate of the read transistor 17. Moreover, the gate contact GCA is connected to the node combining contact 105A through a contact plug CPC, and the gate contact GCB is connected to the word line WL[m] through a contact plug CPD. The node combining contact 105A is the node N11 in the circuit.

The gate contact GCC is formed in the first direction so as to cover the N type diffusion layer 101A, and acts as the gate of the driver transistor 16. Moreover, the gate contact GCC is connected to the node combining contact 105A through a contact plug CPE.

On the N type diffusion layer 101A, the contact plug CPA, the gate contact GCA, the gate contact GCC, and the contact plug CPB are sequentially arranged so that the current path may be in series from the bit line BL[n] to the VSS 104A.

The gate contacts GCB to GCD are formed over the N type diffusion layer 101B. Moreover, one end of the N type diffusion layer 101B is connected to the bit line BL[n] through a contact plug CPG, and the other end of the N type diffusion layer 101B is connected to the VSS line 104A through a contact plug CPH. Further, a node combining contact 105B is connected to the N type diffusion layer 101B through a contact plug CPI between the ends of the N type diffusion layer 101B. The node combining contact 105B is the node N10 in the circuit.

The gate contacts GCB and GCD are formed on the same line in the first direction so as to sandwich the N type diffusion layer 101B therebetween. The gate contact GCB acts as a front gate of the transfer transistor 14, and the gate contact GCD acts as a back gate of the transfer transistor 14. Moreover, the gate contact GCD is connected to the node combining contact 105B through a contact plug CPJ.

The gate contact GCC is formed in the first direction so as to cover the N type diffusion layer 101B, and acts as a gate of the nMOS transistor 20B within the inverter 20.

On the N type diffusion layer 101B, the contact plug CPG, the gate contact GCB, the contact plug CPI, the gate contact GCC, and the contact plug CPH are sequentially arranged so that a current path may be in series from the bit line BL[n] to the VSS line 104A.

The gate contact GCC is formed over the P type diffusion layer 102A. Moreover, one end of the P type diffusion layer 102A is connected to the node combining contact 105B through a contact plug CPK, and the other end thereof is connected to the VDD line 103A through a contact plug CPL.

The gate contact GCC is formed in the first direction so as to cover the P type diffusion layer 102A, and acts as a gate of the PMOS transistor 20A within the inverter 20.

On the P type diffusion layer 102A, the contact plug CPL, the gate contact GCC, and the contact plug CPK are sequentially arranged so that the current path may be in series from the VDD line 103A to the node combining contact 105B.

The gate contact GCD is formed over the P type diffusion layer 102B. Moreover, one end of the P type diffusion layer 102B is connected to the node combining contact 105A through a contact plug CPM, and the other end thereof is connected to the VDD line 103B through a contact plug CPN.

The gate contact GCD is formed in the first direction so as to cover the P type diffusion layer 102B, and acts as a gate of the pMOS transistor 21A within the inverter 21.

On the P type diffusion layer 102B, the contact plug CPN, the gate contact GCD, and the contact plug CPM are sequentially arranged so that a current path may be in series from the VDD line 103B to the node combining contact 105A.

The gate contacts GCC to GCE are formed over the N type diffusion layer 101C. Moreover, one end of the N type diffusion layer 101C is connected to the bit line /BL[n] through a contact plug CPP, and the other end thereof is connected to the VSS line 104B through a contact plug CPQ. Further, the node combining contact 105A is connected through a contact plug CPR to the N type diffusion layer 101C between the ends of the N type diffusion layer 101C.

The gate contacts GCC and GCE are formed on the same line in the first direction so as to sandwich the N type diffusion layer 101C therebetween. The gate contact GCC acts as a back gate of the transfer transistor 15, and the gate contact GCE acts as a front gate of the transfer transistor 15. Moreover, the gate contact GCC is connected to the node combining contact 105A through a contact plug CPF, and the gate contact GCE is connected to the word line WL[m] through a contact plug CPS.

The gate contact GCD is formed in the first direction so as to cover the N type diffusion layer 101C, and acts as the gate of the nMOS transistor 21B within the inverter 21.

On the N type diffusion layer 101C, the contact plug CPP, the gate contact GCC, the contact plug CPR, the gate contact GCD, and the contact plug CPQ are sequentially arranged so that the current path may be in series from the bit line /BL[n] to the VSS 104B.

Figure 11:
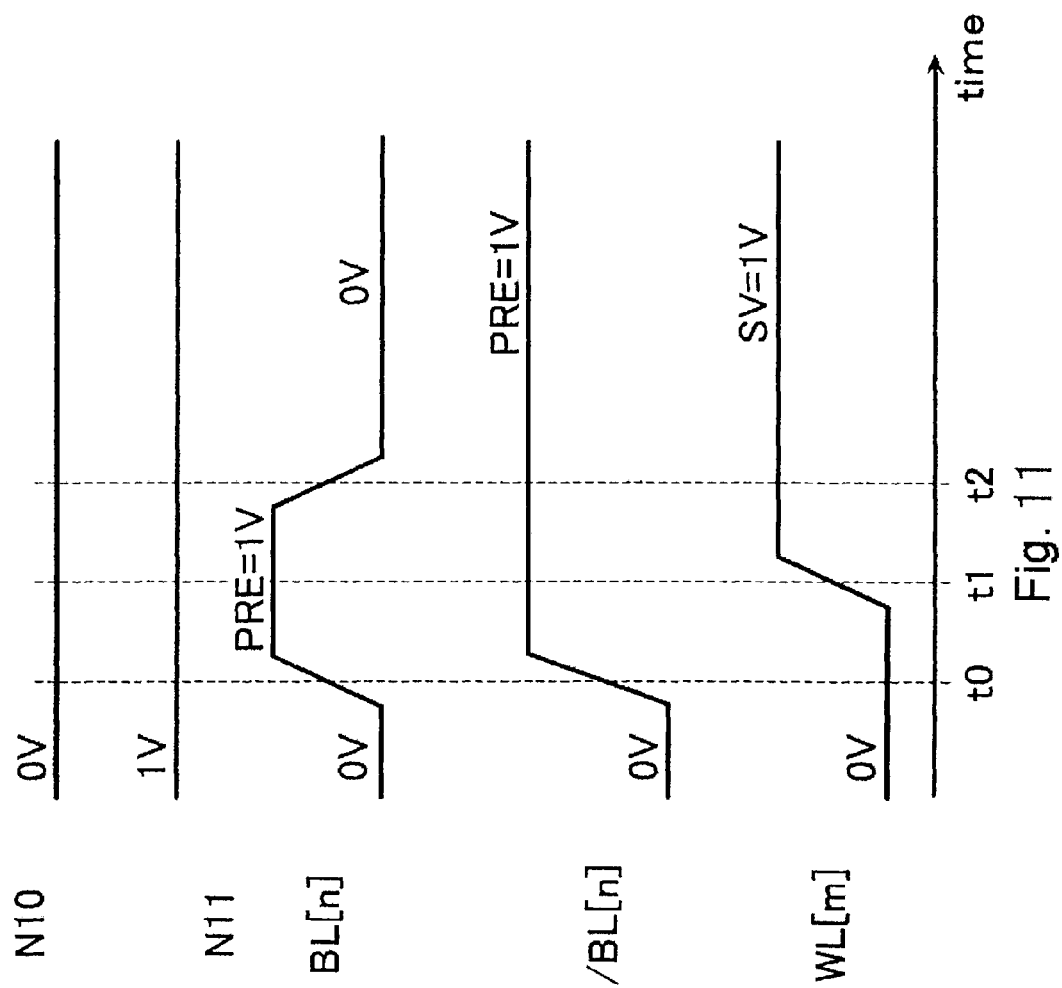
FIG. 11 is a timing chart of the SRAM according to the third embodiment at the time of reading.

Next, a read operation of the SRAM according to the third embodiment will be described, using FIG. 9 and FIG. 11. FIG. 11 is a timing chart at the time of reading in the third embodiment. As an example, description will be given of a case where the data "0" is stored in the node N10 and the data "1" is stored in the node N11 within the memory cell MC which is shown in FIG. 9 and connected to the intersection of the word line WL[m] and the pair of bit lines BL[n] and /BL[n].

As shown in FIG. 11, at time t0, a precharge circuit not shown applies a precharge voltage PRE to the bit line BL[n] and /BL[n] to which the memory cell MC is connected. The precharge voltage PRE is 1 V, for example.

Next, a time t1, a row decoder not shown applies a selection voltage SV to the word line WL[m] to which the memory cell MC is connected. The selection voltage SV is 1 V, for example.

Then, the transfer transistors 14 and 15 and the read transistor 17 are conducted by the selection voltage SV. Here, the word line WL[m] is connected to the gates of the transfer transistors 14 and 15 and the gate of the read transistor 17.

As shown in FIG. 9, the third embodiment includes the driver transistor 16 and the read transistor 17, and the back gate of the read transistor 17 is connected to the node N11.

When the data "0" is stored in the node N10, since the data "1" is stored in the node N11, a voltage of the data "1", is applied to the gate of the driver transistor 16 and the back gate of the read transistor 17. Thereby, the driver transistor 16 is conducted.

Further, since the selection voltage SV is applied to the word line WL [m], a selection voltage SV is applied also to the gate of the read transistor 17 so that the read transistor 17 is also conducted. Moreover, since the voltage of the data "1" is applied to the back gate of the read transistor 17, a threshold voltage of the read transistor 17 drops. Thereby, the read transistor 17 is easy to be conducted, in other words, is in a state where the data reading speed is high.

In the third embodiment, when the data "0" stored in the node N10 is read, the ground voltage VSS connected to the source of the driver transistor 16 is read to the bit line BL[n] through the driver transistor 16 and the read transistor 17. Thereby, reduction of the reading speed can be prevented as shown in FIG. 11. On the other hand, when the data "1" stored in the node N10 is read, the voltage of the data "0" is applied to the back gate of the read transistor 17. For that reason, the threshold voltage of the read transistor 17 is high, so that leakage current can be reduced.

In the first embodiment, since a read voltage RV is applied to the column selection line COL at the time of reading, the voltage of the data "1" is applied to the back gate of the driver transistor 16 and that of the read transistor 17. Since the voltage of the data "0" is applied to the front gate of the driver transistor 16 when the data "1" is stored in the node N10, the driver transistor 16 is not conducted. In other words, the current path is not formed from the bit line BL[n] to the VSS connected to the source of the driver transistor 16. However, since the read voltage RV is applied to the back gate of the driver transistor 16, leakage current may occur in the driver transistor 16.

To the contrary, in the third embodiment, when the data "1" is stored in the node N10, the voltage of the data "0" stored in the node N11 is applied to the back gate of the read transistor 17. This makes it hard for the read transistor 17 to be conducted. In addition, since the driver transistor 16 is formed of a single gate FinFET, generation of leakage current can be prevented.

As mentioned above, in the third embodiment, it is possible to prevent the leakage current generated in the memory cell MC when the data "1" is stored in the node N10, in addition to the effects obtained in the first embodiment.

Fourth Embodiment

Figure 12:
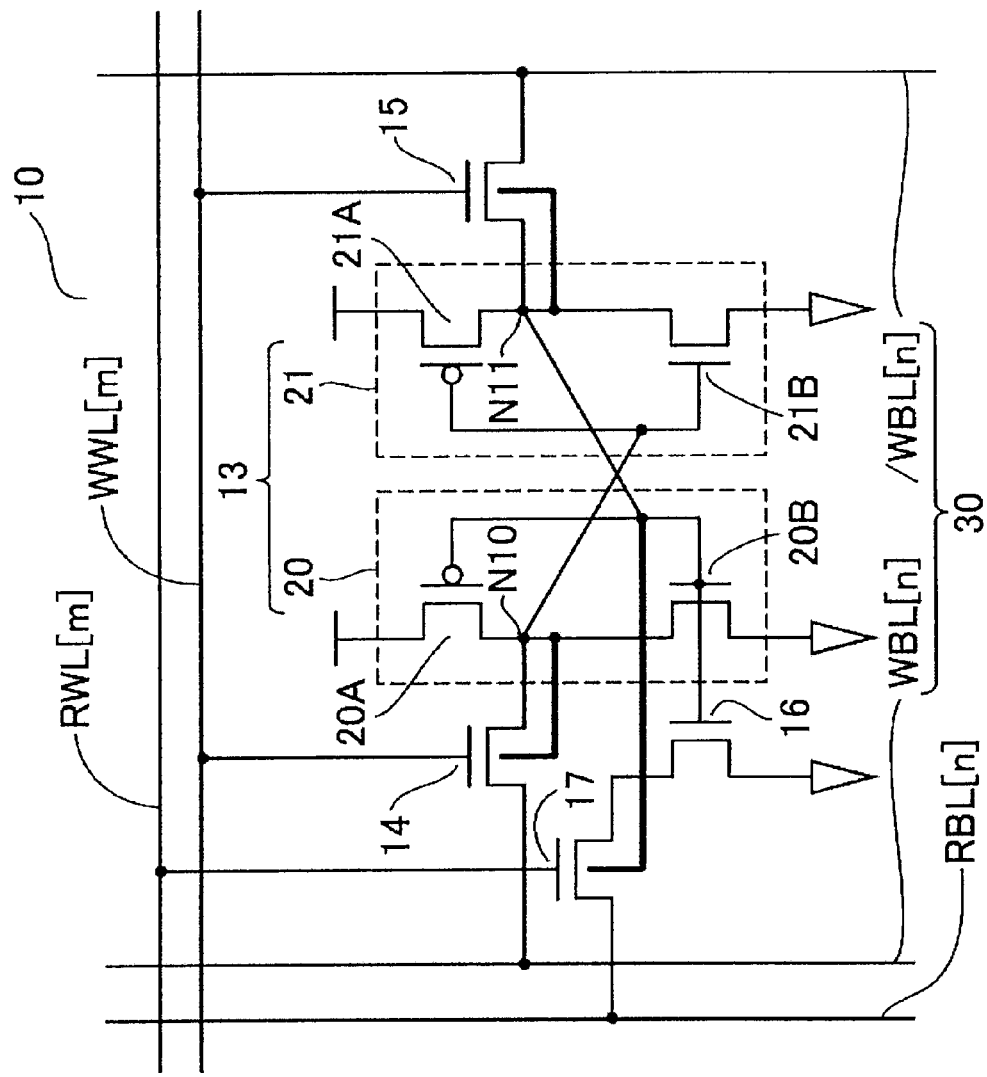
FIG. 12 is a circuit diagram showing a part of an SRAM according to a fourth embodiment.

FIG. 12 is an equivalent circuit diagram showing a part of an SRAM 10 according to a fourth embodiment of the present invention. As shown in FIG. 12, the fourth embodiment has a configuration in which the word line WL[m] and the bit line BL[n] in the third embodiment are replaced with two word lines WL[m] for reading and writing and two bit lines BL[n] for reading and writing (word lines WWL/RWL, bit lines WBL/RBL). Only this point is different from the third embodiment, and the other points are the same as those in the third embodiment. In FIG. 12, the same reference numerals are given to the same portions as those in the third embodiment, and the detailed description thereof will be omitted below.

Each of memory cells MC that constitute the SRAM 10 according to the fourth embodiment is formed at an intersection of the write word line WWL and read word line RWL arranged in a first direction, and the write bit lines WBL and read bit line RBL arranged in a second direction. For convenience in description, FIG. 12 shows a memory cell MC formed at an intersection of a write word line WWL[m] and write bit lines WBL[n] and /WBL[n] (where m and n are natural numbers).

The memory cell MC has a data storage unit 13 formed by cross-coupling an inverter 20 to an inverter 21. The inverter 20 is formed by connecting a pMOS transistor 20A and an nMOS transistor 20B in series, while the inverter 21 is formed by connecting a pMOS transistor 21A and an nMOS transistor 21B in series. This point is the same as that in the third embodiment.

Between the write bit line WBL[n] and an output terminal of the inverter 20, a transfer transistor 14 is formed for data transfer. Similarly, between the write bit line /WBL[n] and an output terminal of the inverter 21, a transfer transistor 15 is formed for data transfer.

The write word line WWL[m] is connected to a gate of the transfer transistor 14, and the write bit line WBL[n] is connected to a drain of the transfer transistor 14. A node N10 is connected to a source of the transfer transistor 14, the output terminal of the inverter 20 and an input terminal of the inverter 21. The write word line WWL[m] is connected to a gate of the transfer transistor 15, and the write bit line /WBL[n] is connected to a drain of the transfer transistor 15. A node N11 is connected to a source of the transfer transistor 15, the output terminal of the inverter 21 and an input terminal of the inverter 20.

Further, a gate of a driver transistor 16 is connected to the node N11, and a gate of a read transistor 17 is connected to the read word line RWL[m]. The read bit line RBL[n] is connected to a drain of the read transistor 17, and a source of the read transistor 17 is connected to a drain of the driver transistor 16. A ground voltage VSS is supplied to a source of the driver transistor 16.

Transistors that constitute the memory cells MC within the SRAM according to the fourth embodiment are formed of a single gate FinFET. In contrast, only the transfer transistors 14 and 15 and the read transistor 17 are formed of a double gate FinFET.

A back gate of the transfer transistor 14 is connected to the node N10, and a back gate of the transfer transistor 15 and the read transistor 17 is connected to the node N11.

Moreover, similarly to the example shown in FIG. 6B, only the bit line BL may be divided into two bit lines for writing and for reading. Alternatively, similarly to the example shown in FIG. 6C, only the word line WL may be divided into two word lines for writing and reading. Each of the configurations mentioned above has the same effects as those in the second embodiment.

It is also possible to provide a pair of read bit lines RBL[n] and /RBL[n] for one memory cell MC. In this case, the driver transistor 16 and the read transistor 17 may be formed on the read bit line /RBL[n] side. Further, similarly to the example shown in FIG. 1B, the driver transistor 16 and the read transistor 17 may be formed both on the read bit line RBL[n] side and on the read bit line /RBL[n] side. In other words, the driver transistor 16 and the read transistor 17 may be formed not only on the inverter 20 side but also on the inverter 21 side. Accordingly, a gate of the second driver transistor 16 is connected to the node N10, and a gate of the second read transistor 17 is connected to the word line WL[m]. The read bit line /RBL[n] is connected to a drain of the second read transistor 17, and a source of the second read transistor 17 is connected to a drain of the second driver transistor 16. A ground voltage VSS is supplied to a source of the second driver transistor 16. Moreover, the second driver transistor and the second read transistor are also formed of a double gate FinFET.

The number of the memory cells MC and the like that constitute the SRAM according to the fourth embodiment is not limited to the number shown in FIG. 12.

Figure 13:
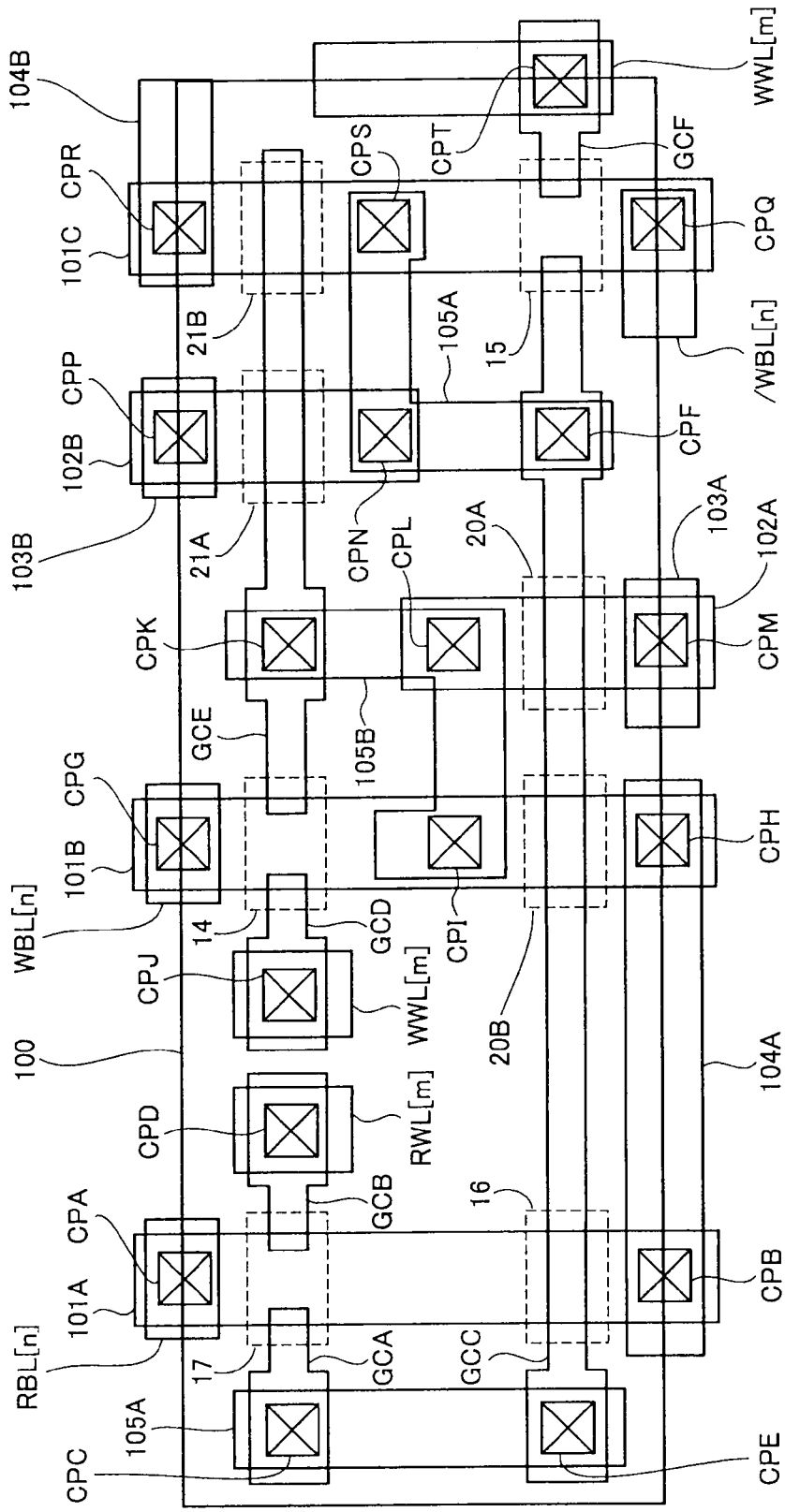
FIG. 13 is a partial plan view of the SRAM according to the fourth embodiment.

Next, description will be given on a layout of the memory cell MC that constitutes the SRAM according to the fourth embodiment, using FIG. 13. FIG. 13 is a plan view of the memory cell MC shown in FIG. 12. In FIG. 13, the same reference numerals are given to the same portions as those in the first embodiment, and the detailed description thereof will be omitted below.

The memory cell MC has N type diffusion layers 101A to 101C and P type diffusion layers 102A and 102B formed on a well 100 of a silicon substrate in the second direction. Moreover, gate contacts GCA to GCF are formed in the first direction so as to intersect with the diffusion layers 101 and 102. A plurality of N type diffusion layers 101 are referred to as 101A, 101B, . . . , and they are collectively referred to as 101, without A, B, . . . attached. Other components (102 to 105, GC, CP) are also referred to in the same manner.

The gate contact GC is formed, for example, of polysilicon. However, the present embodiment is not limited to that. Hereinafter, a layer in which the N type diffusion layer 101 and the P type diffusion layer 102 are formed is referred to as an active area. As mentioned above, the transistors that constitute the SRAM according to the fourth embodiment are formed of the single gate FinFET, and some the transistors are formed of the double gate FinFET. In the single gate FinFET, the gate contact GC is formed to cover the diffusion layers 101 and 102. The double gate FinFET is formed so that the diffusion layer 101 or 102 may be sandwiched by different gate contacts GC from the right and left, as shown in FIG. 2. These points are the same as those in the first embodiment.

On a first wiring layer on the active area, the write word line WWL[m], the read word line RWL[m], the write bit lines WBL[n] and /WBL[n], the read bit line RBL[n], a VDD line 103, a VSS line 104, a node combining contact 105 are formed. The first wiring layer is connected to the active area by a contact plug CP.

The gate contacts GCA to GCC are formed over the N type diffusion layer 101A. Moreover, one end of the N type diffusion layer 101A is connected to the read bit line RBL[n] through a contact plug CPA, and the other end of the N type diffusion layer 101A is connected to a VSS line 104A through a contact plug CPB.

The gate contacts GCA and GCB are formed on the same line in the first direction so as to sandwich the N type diffusion layer 101A therebetween. The gate contact GCA acts as a back gate of the read transistor 17, and the gate contact GCB acts as a front gate of the read transistor 17. Moreover, the gate contact GCA is connected to a node combining contact 105A through a contact plug CPC, and the gate contact GCB is connected to the read word line RWL[m] through a contact plug CPD. The node combining contact 105A is the node N11 in the circuit.

The gate contact GCC is formed in the first direction so as to cover the N type diffusion layer 101A, and acts as the gate of the driver transistor 16. Moreover, the gate contact GCC is connected to the node combining contact 105A through a contact plug CPE.

On the N type diffusion layer 101A, the contact plug CPA, the gate contact GCA, the gate contact GCC, and the contact plug CPB are sequentially arranged so that a current path may be in series from the read bit line RBL[n] to the VSS line 104A.

The gate contacts GCC to GCE are formed over the N type diffusion layer 101B. Moreover, one end of the N type diffusion layer 101B is connected to the write bit line WBL[n] through a contact plug CPG, and the other end thereof is connected to the VSS line 104A through a contact plug CPH. Further, a node combining contact 105B is connected through a contact plug CPI to the N type diffusion layer 101B between the one ends of the N type diffusion layer 101B. The node combining contact 105B is the node N10 in the circuit.

The gate contacts GCD and GCE are formed on the same line in the first direction so as to sandwich the N type diffusion layer 101B therebetween. The gate contact GCD acts as a front gate of the transfer transistor 14, and the gate contact GCE acts as a back gate of the transfer transistor 14. Moreover, the gate contact GCD is connected to the write word line WWL[m] through a contact plug CPJ, and the gate contact GCE is connected to the node combining contact 105B through a contact plug CPK.

The gate contact GCC is formed in the first direction so as to cover the N type diffusion layer 101B, and acts as a gate of the nMOS transistor 20B within the inverter 20.

On the N type diffusion layer 101B, the contact plug CPG, the gate contact GCD, the contact plug CPI, the gate contact GCC, and the contact plug CPH are sequentially arranged so that a current path may be in series from the write bit line WBL[n] to the VSS 104A.

The gate contact GCC is formed over the P type diffusion layer 102A. Moreover, one end of the P type diffusion layer 102A is connected to the node combining contact 105B through a contact plug CPL, and the other end of the P type diffusion layer 102A is connected to a VDD line 103A through a contact plug CPM.

The gate contact GCC is formed in the first direction so as to cover the P type diffusion layer 102A, and acts as a gate of the PMOS transistor 20A within the inverter 20.

On the P type diffusion layer 102A, the contact plug CPM, the gate contact GCC, and the contact plug CPL are sequentially arranged that a current path may be in series from the VDD line 103A to the node combining contact 105B.

The gate contact GCE is formed over the P type diffusion layer 102B. Moreover, one end of the P type diffusion layer 102B is connected to the node combining contact 105A through a contact plug CPN, and the other end thereof is connected to a VDD line 103B through a contact plug CPP.

The gate contact GCE is formed in the first direction so as to cover the P type diffusion layer 102B, and acts as a gate of the PMOS transistor 21A within the inverter 21.

On the P type diffusion layer 102B, the contact plug CPP, the gate contact GCE, and the contact plug CPN are sequentially arranged that a current path may be in series from the VDD line 103B to the node combining contact 105A.

The gate contacts GCC, GCE, and GCF are formed over the N type diffusion layer 101C. Moreover, one end of the N type diffusion layer 101C is connected to the write bit line /WBL[n] through a contact plug CPQ, and the other end thereof is connected to the VSS line 104B through a contact plug CPR. Further, the node combining contact 105A is connected to the N type diffusion layer 101C through a contact plug CPS between the ends of the N type diffusion layer 101C.

The gate contacts GCC and GCF are formed on the same line in the first direction so as to sandwich the N type diffusion layer 101C therebetween. The gate contact GCC acts as a back gate of the transfer transistor 15, and the gate contact GCF acts as a front gate of the transfer transistor 15. Moreover, the gate contact GCC is connected to the node combining contact 105A through a contact plug CPF, and the gate contact GCF is connected to the write word line WWL[m] through a contact plug CPT.

The gate contact GCE is formed in the first direction so as to cover the N type diffusion layer 101C, and acts as the gate of the nMOS transistor 21B within the inverter 21.

On the N type diffusion layer 101C, the contact plug CPQ, the gate contact GCC, the contact plug CPS, the gate contact GCE, and the contact plug CPR are sequentially arranged so that a current path may be in series from the write bit line /WBL[n] to the VSS line 104B.

Figure 14:
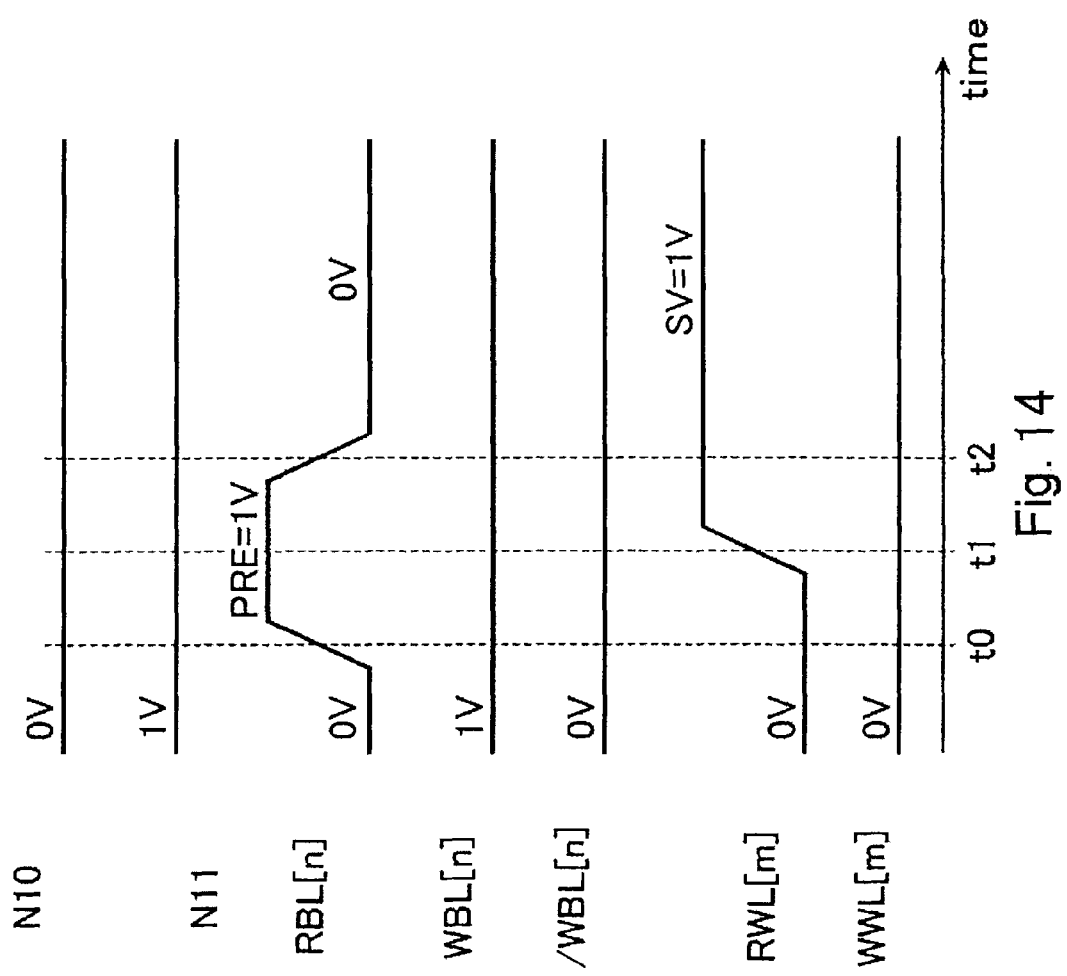
FIG. 14 is a timing chart of the SRAM according to the fourth embodiment at the time of reading.

Next, a read operation of the SPAM according to the fourth embodiment will be described, using FIG. 12 and FIG. 14. FIG. 14 is a timing chart at the time of reading in the fourth embodiment. As an example, description will be given of a case where the data "0" is stored in the node N10 and the data "1" is stored in the node N11 within the memory cell MC which is shown in FIG. 12 and connected to the intersection of the read word line RWL[m] and the read bit line RBL[n].

As shown in FIG. 14, at time t0, a precharge circuit not shown applies a precharge voltage PRE to the read bit line RBL[n], to which the memory cell MC is connected. The precharge voltage PRE is 1 V, for example. As shown in FIG. 14, 0 V is applied to the write word line WWL[m]. Accordingly, in the fourth embodiment, the write bit lines WBL[n] and /WBL[n] are completely separated from the data storage unit 13 at the time of reading.

Next, at time t1, a row decoder not shown applies a selection voltage SV to the read word line RWL[m] to which the memory cell MC is connected. The selection voltage SV is 1 V, for example. As shown in FIG. 14, no read voltage is applied to the write word line WWL[m]. Accordingly, in the fourth embodiment, since the transfer transistors 14 and 15 are not conducted at the time of reading, read disturbance of selected and non-selected memory cells MC can be prevented.

Next, the read transistor 17 is conducted by a selection voltage SV. Here, the read word line RWL[m] is connected to the gate of the read transistor 17.

As shown in FIG. 12, the fourth embodiment includes the driver transistor 16 and the read transistor 17, and the back gate of the read transistor 17 is connected to the node N11.

When the data "0" is stored in the node N10, since the data "1" is stored in the node N11, a voltage of the data "1" is applied to the gate of the driver transistor 16 and the back gate of the read transistor 17. Thereby, the driver transistor 16 is conducted.

Further, since the selection voltage SV is applied to the read word line RWL[m], the selection voltage SV is applied also to the gate of the read transistor 17 so that the read transistor 17 is also conducted. Moreover, since the voltage of the data "1" is applied to the back gate of the read transistor 17, a threshold voltage of the read transistor 17 drops. Thereby, the read transistor 17 is easy to be conducted, in other words, is in a state where the data reading speed is high.

In the fourth embodiment, when the data "0" stored in the node N10 is read, the ground voltage VSS connected to the source of the driver transistor 16 is read to the read bit line RBL[n] through the driver transistor 16 and the read transistor 17. Thereby, reduction of the reading speed can be prevented. On the other hand, when the data "1" stored in the node N10 is read, the driver transistor 16 is not conducted. Accordingly, the read bit line RBL[n] is in a high impedance state, with the precharge voltage PRE maintained.

As mentioned above, in the fourth embodiment, it is possible to prevent read disturbance of selected and non-selected memory cells MC, in addition to the effects obtained in the third embodiment.

While the invention is subject to various modifications and alternative forms, specific embodiments thereof are shown by way of embodiments in the drawings and the accompanying detailed description. It should be understood that the drawings and detailed description are not intended to limit the invention to the particular embodiments which are described. This disclosure is instead intended to cover all modifications, equivalents and alternatives falling within the scope of the present invention as defined by the appended claims.

What is claimed is:

1. A semiconductor memory device, comprising:
a bit line pair having a first bit line and a second bit line;
a word line; and
a memory cell formed between the bit line pair, wherein the memory cell comprises;
an inverter pair including a first inverter and a second inverter which are cross-coupled to each other,
a first transfer transistor provided between the first bit line and an output terminal of the first inverter and including a first front gate and a first back gate, the first front gate connected to the word line, the first back gate connected to a first node to which an output terminal of the first inverter and an input terminal of the second inverter are connected,
a second transfer transistor provided between the second bit line and an output terminal of the second inverter and having a second front gate and a second back gate, the second front gate connected to the word line, the second back gate connected to a second node to which an output terminal of the second inverter and an input terminal of the first inverter are connected,
a first driver transistor including a first gate connected to the second node, and one end of a first current path connected to a ground voltage, and
a first read transistor including a third front gate and a third back gate, the third front gate connected to the word line, the read transistor including one end of a second current path connected to another end of the first current path, and another end of the second current path connected to the first bit line,
wherein the third back gate of the first read transistor is connected to a first column selection line.

2. The semiconductor memory device according to claim 1, wherein the first gate of the first driver transistor has a fourth front gate and a fourth back gate, the fourth front gate connected to the second node, and the fourth back gate of the first driver transistor is connected to the third back gate of the first read transistor.

3. The semiconductor memory device according to claim 1, further comprising:
a second driver transistor including a second gate connected to the first node, and one end of a third current path connected to a ground voltage, and
a second read transistor including a fifth front gate and a fifth back gate, the fifth front gate connected to the word line, the second read transistor including one end of a fifth current path connected to another end of the third current path, and another end of the fourth current path connected to the second bit line.

4. The semiconductor memory device according to claim 3, wherein the fifth back gate of the second read transistor is connected to a second column selection line.

5. The semiconductor memory device according to claim 3, wherein the second gate of the second driver transistor has a sixth front gate and a sixth back gate, the sixth front gate connected to the first node, and the sixth back gate of the second driver transistor is connected to the fifth back gate of the second read transistor.

6. The semiconductor memory device according to claim 3, wherein the fifth back gate of the second read transistor is connected to the first node.

7. A semiconductor memory device, comprising:
a bit line pair having a first bit line and a second bit line;
a word line; and
a memory cell formed between the bit line pair, wherein the memory cell comprises;
an inverter pair including a first inverter and a second inverter which are cross-coupled to each other,
a first transfer transistor provided between the first bit line and an output terminal of the first inverter and including a first front gate and a first back gate, the first front gate connected to the word line, the first back gate connected to a first node to which an output terminal of the first inverter and an input terminal of the second inverter are connected,
a second transfer transistor provided between the second bit line and an output terminal of the second inverter and having a second front gate and a second back gate, the second front gate connected to the word line, the second back gate connected to a second node to which an output terminal of the second inverter and an input terminal of the first inverter are connected,
a first driver transistor including a first gate connected to the second node, and one end of a first current path connected to a ground voltage, and
a first read transistor including a third front gate and a third back gate, the third front gate connected to the word line, the read transistor including one end of a second current path connected to another end of the first current path, and another end of the second current path connected to the first bit line,
wherein the third back gate of the first read transistor is connected to the second node.

8. A semiconductor memory device, comprising:
a bit line pair having a first bit line and a second bit line;
a read word line;
a write word line; and
a memory cell formed between the bit line pair, wherein the memory cell comprises;
an inverter pair including a first inverter and a second inverter which are cross-coupled to each other,
a first transfer transistor provided between the first bit line and an output terminal of the first inverter and including a first front gate and a first back gate, the first front gate connected to the write word line, the first back gate connected to a first node to which an output terminal of the first inverter and an input terminal of the second inverter are connected,
a second transfer transistor provided between the second bit line and an output terminal of the second inverter and having a second front gate and a second back gate, the second front gate connected to the write word line, the second back gate connected to a second node to which an output terminal of the second inverter and an input terminal of the first inverter are connected,
a first driver transistor including a first gate connected to the second node, and one end of a first current path connected to a ground voltage, and
a first read transistor including a third front gate and a third back gate, the third front gate connected to the read word line, the read transistor including one end of a second current path connected to another end of the first current path, and another end of the second current path connected to the first bit line,
wherein the third back gate of the first read transistor is connected to a first column selection line.

9. A semiconductor memory device, comprising:
a read bit line;
a write bit line;
a second bit line;
a word line; and
a memory cell formed between the bit lines, wherein the memory cell comprises;
an inverter pair including a first inverter and a second inverter which are cross-coupled to each other,
a first transfer transistor provided between the write bit line and an output terminal of the first inverter and including a first front gate and a first back gate, the first front gate connected to the word line, the first back gate connected to a first node to which an output terminal of the first inverter and an input terminal of the second inverter are connected,
a second transfer transistor provided between the second bit line and an output terminal of the second inverter and having a second front gate and a second back gate, the second front gate connected to the word line, the second back gate connected to a second node to which an output terminal of the second inverter and an input terminal of the first inverter are connected,
a first driver transistor including a first gate connected to the second node, and one end of a first current path connected to a ground voltage, and
a first read transistor including a third front gate and a third back gate, the third front gate connected to the word line, the read transistor including one end of a second current path connected to another end of the first current path, and another end of the second current path connected to the read bit line,
wherein the third back gate of the first read transistor is connected to a first column selection line.

10. The semiconductor memory device according to claim 1, wherein the memory cell comprises:
a first n type diffusion layer formed in a first direction, the first read transistor and the first driver transistor being formed on the first n type diffusion layer,
a second n type diffusion layer formed in the first direction, the second transfer transistor and an n type transistor of the second inverter being formed on the second n type diffusion layer,
a third n type diffusion layer formed in the first direction between the first n type diffusion layer and the second n type diffusion layer, the first transfer transistor and an n type transistor of the first inverter being formed on the third n type diffusion layer,
a first p type diffusion layer formed in the first direction between the second n type diffusion layer and the third n type diffusion layer, a p type transistor of the first inverter being formed on the first p type diffusion layer, and
a second p type diffusion layer formed in the first direction between the first p type diffusion layer and the second n type diffusion layer, a p type transistor of the second transistor being formed on the second p type diffusion layer.

11. The semiconductor memory device according to claim 10, wherein
the first read transistor, the first transfer transistor, and the second inverter are formed on a same line in a second direction, and
the first driver transistor, the second transfer transistor, and the first inverter are formed on a same line in the second direction.

12. The semiconductor memory device according to claim 10, wherein
the first bit line is coupled to the first n type diffusion layer and the third n type diffusion layer via a first contact and a second contact, and
the second bit line is coupled to the second n type diffusion layer via a third contact.

13. The semiconductor memory device according to claim 7, wherein the memory cell comprises:
a first n type diffusion layer formed in a first direction, the first read transistor and the first driver transistor being formed on the first n type diffusion layer,
a second n type diffusion layer formed in the first direction, the second transfer transistor and an n type transistor of the second inverter being formed on the second n type diffusion layer,
a third n type diffusion layer formed in the first direction between the first n type diffusion layer and the second n type diffusion layer, the first transfer transistor and an n type transistor of the first inverter being formed on the third n type diffusion layer,
a first p type diffusion layer formed in the first direction between the second n type diffusion layer and the third n type diffusion layer, a p type transistor of the first inverter being formed on the first p type diffusion layer, and
a second p type diffusion layer formed in the first direction between the first p type diffusion layer and the second n type diffusion layer, a p type transistor of the second transistor being formed on the second p type diffusion layer.

14. The semiconductor memory device according to claim 13, wherein
the first read transistor, the first transfer transistor, and the second inverter are formed on a same line in a second direction,
the first driver transistor, the second transfer transistor, and the first inverter are formed on a same line in the second direction.

15. The semiconductor memory device according to claim 13, wherein
the first bit line is coupled to the first n type diffusion layer and the third n type diffusion layer via a first contact and a second contact, and
the second bit line is coupled to the second n type diffusion layer via a third contact.

16. The semiconductor memory device according to claim 10, further comprising a column selection line formed in the first direction and formed proximate to the first n type diffusion layer.

17. A semiconductor memory device, comprising:
a bit line pair having a first bit line and a second bit line;
a read word line;
a write word line; and
a memory cell formed between the bit line pair, wherein the memory cell comprises;
an inverter pair including a first inverter and a second inverter which are cross-coupled to each other,
a first transfer transistor provided between the first bit line and an output terminal of the first inverter and including a first front gate and a first back gate, the first front gate connected to the write word line, the first back gate connected to a first node to which an output terminal of the first inverter and an input terminal of the second inverter are connected,
a second transfer transistor provided between the second bit line and an output terminal of the second inverter and having a second front gate and a second back gate, the second front gate connected to the write word line, the second back gate connected to a second node to which an output terminal of the second inverter and an input terminal of the first inverter are connected,
a first driver transistor including a first gate connected to the second node, and one end of a first current path connected to a ground voltage, and
a first read transistor including a third front gate and a third back gate, the third front gate connected to the read word line, the read transistor including one end of a second current path connected to another end of the first current path, and another end of the second current path connected to the first bit line,
wherein the third back gate of the first read transistor is connected to the second node,
wherein:
the read word line applies a selection voltage at a time of reading, and
the write word line applies the selection voltage at a time of writing.

18. A semiconductor memory device, comprising:
a bit line pair having a first bit line and a second bit line;
a read word line;
a write word line; and
a memory cell formed between the bit line pair, wherein the memory cell comprises;
an inverter pair including a first inverter and a second inverter which are cross-coupled to each other,
a first transfer transistor provided between the first bit line and an output terminal of the first inverter and including a first front gate and a first back gate, the first front gate connected to the write word line, the first back gate connected to a first node to which an output terminal of the first inverter and an input terminal of the second inverter are connected,
a second transfer transistor provided between the second bit line and an output terminal of the second inverter and having a second front gate and a second back gate, the second front gate connected to the write word line, the second back gate connected to a second node to which an output terminal of the second inverter and an input terminal of the first inverter are connected,
a first driver transistor including a first gate connected to the second node, and one end of a first current path connected to a ground voltage,
a first read transistor including a third front gate and a third back gate, the third front gate connected to the read word line, the read transistor including one end of a second current path connected to another end of the first current path, and another end of the second current path connected to the first bit line, wherein the third back gate of the first read transistor is connected to the second node.

* * * * *